(12) United States Patent
Sakamoto et al.

(10) Patent No.: US 8,916,945 B2
(45) Date of Patent: Dec. 23, 2014

(54) SEMICONDUCTOR LIGHT-DETECTING ELEMENT

(75) Inventors: Akira Sakamoto, Hamamatsu (JP);
Takashi Iida, Hamamatsu (JP); Koei Yamamoto, Hamamatsu (JP); Kazuhisa Yamamura, Hamamatsu (JP);
Terumasa Nagano, Hamamatsu (JP)

(73) Assignee: Hamamatsu Photonics K.K., Hamamatsu-shi, Shizuoka (JP)

(*) Notice: Subject to any disclaimer, the term of this patent is extended or adjusted under 35 U.S.C. 154(b) by 82 days.

(21) Appl. No.: 13/147,871

(22) PCT Filed: Feb. 15, 2010

(86) PCT No.: PCT/JP2010/052210
§ 371 (c)(1),
(2), (4) Date: Aug. 4, 2011

(87) PCT Pub. No.: WO2010/098224
PCT Pub. Date: Sep. 2, 2010

(65) Prior Publication Data
US 2011/0303999 A1 Dec. 15, 2011

(30) Foreign Application Priority Data

Feb. 24, 2009 (JP) ................................. 2009-041078
Jun. 5, 2009 (JP) ................................. 2009-136389

(51) Int. Cl.
*H01L 27/14* (2006.01)
*H01L 31/0236* (2006.01)
(Continued)

(52) U.S. Cl.
CPC ...... *H01L 31/02366* (2013.01); *H01L 31/0236* (2013.01); *H01L 31/1804* (2013.01);
(Continued)

(58) Field of Classification Search
CPC .............. H01L 27/14609; H01L 27/14643; H01L 31/0232; H01L 31/103; H01L 27/1446; H01L 31/0236; H01L 31/02366; H01L 31/035281; H01L 31/1804; Y02E 10/547

USPC ........ 257/290, 292, 293, 414, 431, 432, 433, 257/434, 436, 438, 443, 447, 461, 464, 466, 257/E33.076, E31.001; 250/370.01, 200, 250/205, 208.1
See application file for complete search history.

(56) References Cited

U.S. PATENT DOCUMENTS 4,072,541 A 2/1978 Meulenberg, Jr. et al.
4,277,793 A * 7/1981 Webb ............................. 257/436
(Continued)

FOREIGN PATENT DOCUMENTS

CN 86 1 08413 8/1987
CN 1227419 9/1999
(Continued)

OTHER PUBLICATIONS

Office Action dated Aug. 7, 2012 that issued in U.S. Appl. No. 13/143,765 including Double Patenting rejection at pp. 2-4.
(Continued)

*Primary Examiner* — Lynne Gurley
*Assistant Examiner* — Galina Yushina
(74) *Attorney, Agent, or Firm* — Drinker Biddle & Reath LLP

(57) ABSTRACT

Prepared is an $n^-$ type semiconductor substrate 1 having a first principal surface 1a and a second principal surface 1b opposed to each other, and having a $p^+$ type semiconductor region 3 formed on the first principal surface 1a side. At least a region opposed to the $p^+$ type semiconductor region 3 in the second principal surface 1b of the $n^-$ type semiconductor substrate 1 is irradiated with a pulsed laser beam to form an irregular asperity 10. After formation of the irregular asperity 10, an accumulation layer 11 with an impurity concentration higher than that of the $n^-$ type semiconductor substrate 1 is formed on the second principal surface 1b side of the n type semiconductor substrate 1. After formation of the accumulation layer 11, the $n^-$ type semiconductor substrate 1 is subjected to a thermal treatment.

4 Claims, 36 Drawing Sheets

(51) Int. Cl.
 *H01L 31/18* (2006.01)
 *H01L 27/144* (2006.01)
 *H01L 31/0352* (2006.01)

(52) U.S. Cl.
 CPC .... *H01L 27/1446* (2013.01); *H01L 31/035281* (2013.01); *Y02E 10/547* (2013.01)
 USPC .......... 257/431; 257/290; 257/461; 257/434; 257/E31.054; 257/E31.13; 250/370.01; 250/200; 250/205; 250/208.1

(56) References Cited

U.S. PATENT DOCUMENTS

| | | | |
|---|---|---|---|
| 5,589,704 A * | 12/1996 | Levine | 257/436 |
| 7,057,256 B2 | 6/2006 | Carey, III et al. | |
| 7,084,443 B2 | 8/2006 | Kitano et al. | |
| 7,420,257 B2 | 9/2008 | Shibayama | |
| 8,008,741 B2 | 8/2011 | Yamamura et al. | |
| 2001/0008144 A1 | 7/2001 | Uematsu et al. | |
| 2005/0127401 A1 | 6/2005 | Mazur et al. | |
| 2006/0108617 A1 | 5/2006 | Kitano et al. | |
| 2006/0278898 A1* | 12/2006 | Shibayama | 257/228 |
| 2007/0152250 A1 | 7/2007 | Kim | |
| 2008/0001243 A1 | 1/2008 | Otake et al. | |
| 2009/0101197 A1 | 4/2009 | Morikawa | |
| 2009/0121306 A1 | 5/2009 | Ishikawa | |
| 2009/0142874 A1 | 6/2009 | Arai | |
| 2011/0266644 A1* | 11/2011 | Yamamura et al. | 257/431 |
| 2011/0291218 A1 | 12/2011 | Yamamura et al. | |
| 2011/0298076 A1 | 12/2011 | Yamamura et al. | |
| 2011/0303999 A1 | 12/2011 | Sakamoto et al. | |
| 2012/0061785 A1 | 3/2012 | Ishikawa et al. | |

FOREIGN PATENT DOCUMENTS

| | | |
|---|---|---|
| CN | 1826700 | 8/2006 |
| EP | 0616373 | 9/1994 |
| EP | 0883189 | 12/1998 |
| EP | 1619722 | 1/2006 |
| EP | 1648036 | 4/2006 |
| EP | 1 840 967 | 10/2007 |
| EP | 1855322 | 11/2007 |
| JP | S49-034398 | 9/1974 |
| JP | 50-147230 | 11/1975 |
| JP | S59-061973 | 4/1984 |
| JP | S59-117274 | 7/1984 |
| JP | 59-224183 | 12/1984 |
| JP | 62-18075 | 1/1987 |
| JP | S64-011556 | 1/1989 |
| JP | H2-007576 | 1/1990 |
| JP | H3-089518 | 4/1991 |
| JP | H4-116870 | 4/1992 |
| JP | H5-243600 | 9/1993 |
| JP | H6-045623 | 2/1994 |
| JP | H06-244444 | 9/1994 |
| JP | H6-350068 | 12/1994 |
| JP | 7-235658 | 9/1995 |
| JP | H7-240534 | 9/1995 |
| JP | 8-111542 | 4/1996 |
| JP | H08-242015 | 9/1996 |
| JP | H9-307130 | 11/1997 |
| JP | H10-070298 | 3/1998 |
| JP | H10-173998 | 6/1998 |
| JP | H10-335624 | 12/1998 |
| JP | H11-233519 | 8/1999 |
| JP | 2000-299489 | 10/2000 |
| JP | 2002-170981 | 6/2002 |
| JP | 2002-222975 | 8/2002 |
| JP | 2002-231993 | 8/2002 |
| JP | 2003-232679 | 8/2003 |
| JP | 2003-258277 | 9/2003 |
| JP | 2003-258285 | 9/2003 |
| JP | 2005-45073 | 2/2005 |
| JP | 2005-203708 | 7/2005 |
| JP | 2006-179828 | 7/2006 |
| JP | 2006-186262 | 7/2006 |
| JP | 2007-266327 | 10/2007 |
| JP | 2008-060380 | 3/2008 |
| JP | 2008-066584 | 3/2008 |
| JP | 2008-515196 | 5/2008 |
| JP | 2008-153311 | 7/2008 |
| JP | 2008-229701 | 10/2008 |
| JP | 2008-294454 | 12/2008 |
| JP | 5185206 | 4/2013 |
| TW | 200509383 | 3/2005 |
| WO | 98/43304 | 10/1998 |
| WO | WO 00/62344 | 10/2000 |
| WO | WO 03/072500 | 9/2003 |
| WO | WO 03/096427 | 11/2003 |
| WO | WO 2008/004547 | 1/2008 |
| WO | 2008/139644 A1 | 11/2008 |
| WO | WO 2009-016776 | 2/2009 |

OTHER PUBLICATIONS

Huang Zhihong et al., "Micostructured silicon photodetector," Applied Physics Letters, AIP, American Institute of Physics, Melville, NY, US, vol. 89, No. 3, Jul. 20, 2006, p. 33506-1-p. 33506-3, XP012088050.

U.S. Office Action dated Sep. 18, 2013 that issued in U.S. Appl. No. 13/320,912 including Double Patenting Rejections on pp. 3-5.

G. E. Miner et al., "High Volume Processing of Point Contact Solar Cells," Photovoltaic Specialists Conference, Las Vegas, Sep. 26-30, 1988; Photovoltaic Specialists Conference, New York, IEEE, US, Sep. 26, 1988, pp. 518-522, XP000166693.

\* cited by examiner (a)

(b)

(a)

(b)

SEMICONDUCTOR LIGHT-DETECTING ELEMENT

TECHNICAL FIELD

The present invention relates to a semiconductor light-detecting element.

BACKGROUND ART

A photodiode using compound semiconductors is known as a photodiode with a high spectral sensitivity characteristic in the near-infrared wavelength band (e.g., cf. Patent Literature 1). The photodiode described in Patent Literature 1 is provided with a first light receiving layer comprised of one of InGaAsN, InGaAsNSb, and InGaAsNP, and a second light receiving layer having an absorption edge at a longer wavelength than that of the first light receiving layer and comprised of a quantum well structure.

CITATION LIST

Patent Literature

Patent Literature 1: Japanese Patent Application Laid-open No. 2008-153311

SUMMARY OF INVENTION

Technical Problem

However, such photodiodes using the compound semiconductors are still expensive and their manufacturing steps are also complicated. For this reason, there are desires for practical application of a silicon photodiode being inexpensive and easy to manufacture and having sufficient spectral sensitivity in the near-infrared wavelength band. The conventional silicon photodiodes generally had the spectral sensitivity characteristic with the limit of about 1100 nm on the long wavelength side, but the spectral sensitivity characteristic in the wavelength band of not less than 1000 nm was not enough.

It is an object of the present invention to provide a semiconductor light-detecting element using silicon and having a sufficient spectral sensitivity characteristic in the near-infrared wavelength band.

Solution to Problem

A semiconductor light-detecting element according to the present invention is one comprising: a silicon substrate having a pn junction comprised of a semiconductor region of a first conductivity type and a semiconductor region of a second conductivity type, wherein on the silicon substrate, an accumulation layer of the first conductivity type is formed on a principal surface side of the silicon substrate and an irregular asperity is formed in at least a region opposed to the pn junction in the principal surface, and wherein the region opposed to the pn junction in the principal surface of the silicon substrate is optically exposed.

In the semiconductor light-detecting element of the present invention the irregular asperity is formed in at least the region opposed to the pn junction in the principal surface of the silicon substrate. For this reason, light incident into the semiconductor light-detecting element is reflected, scattered, or diffused by the region to travel through a long distance in the silicon substrate. This causes the light incident into the semiconductor light-detecting element to be mostly absorbed in the silicon substrate, without passing through the semiconductor light-detecting element (silicon substrate). In the foregoing semiconductor light-detecting element, therefore, the travel distance of the light incident into the semiconductor light-detecting element becomes long and the distance of absorption of light also becomes long, so as to improve the spectral sensitivity characteristic in the near-infrared wavelength band.

In the semiconductor light-detecting element according to the present invention, the accumulation layer of the first conductivity type is formed on the principal surface side of the silicon substrate. For this reason, unnecessary carriers generated independent of light on the principal surface side recombine there, so as to reduce dark current. The first conductivity type accumulation layer prevents carriers generated by light near the principal surface of the silicon substrate from being trapped in the principal surface. For this reason, the carriers generated by light efficiently migrate to the pn junction, so as to improve the photodetection sensitivity of the semiconductor light-detecting element.

A photodiode according to the present invention is one comprising: a silicon substrate comprised of a semiconductor of a first conductivity type, having a first principal surface and a second principal surface opposed to each other, and having a semiconductor region of a second conductivity type formed on the first principal surface side, wherein on the silicon substrate, an accumulation layer of the first conductivity type having a higher impurity concentration than the silicon substrate is formed on the second principal surface side and an irregular asperity is formed in at least a region opposed to the semiconductor region of the second conductivity type in the second principal surface, and wherein the region opposed to the semiconductor region of the second conductivity type in the second principal surface of the silicon substrate is optically exposed.

In the photodiode according to the present invention, as described above, the travel distance of light incident into the photodiode becomes long and the distance of absorption of light also becomes long, so as to improve the spectral sensitivity characteristic in the near-infrared wavelength band. The accumulation layer of the first conductivity type formed on the second principal surface side of the silicon substrate reduces the dark current and improves the photodetection sensitivity of the photodiode.

Preferably, a portion in the silicon substrate corresponding to the semiconductor region of the second conductivity type is thinned from the second principal surface side while leaving a surrounding region around the thinned portion. In this case, the photodiode can be obtained with respective light incident surfaces on the first principal surface and second principal surface sides of the silicon substrate.

Preferably, a thickness of the accumulation layer of the first conductivity type is larger than a height difference of the irregular asperity. In this case, as described above, it is feasible to ensure the operational effect by the accumulation layer.

Advantageous Effects of Invention

The present invention successfully provides the semiconductor light-detecting element using silicon and having the sufficient spectral sensitivity characteristic in the near-infrared wavelength band.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

First Embodiment

A method for manufacturing a photodiode according to the first embodiment will be described with reference to FIGS. 1 to 10. FIGS. 1 to 10 are drawings for explaining the manufacturing method of the photodiode according to the first embodiment.

Figure 1:
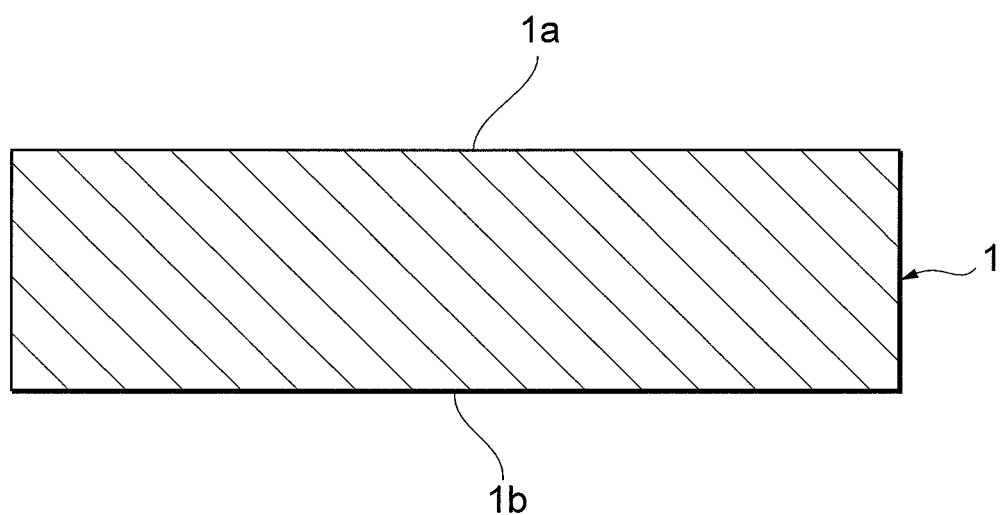
FIG. 1 is a drawing for explaining a manufacturing method of a photodiode according to the first embodiment.

The first step is to prepare an n⁻ type semiconductor substrate 1 comprised of silicon (Si) crystal and having a first principal surface 1$a$ and a second principal surface 1$b$ opposed to each other (cf. FIG. 1). The n⁻ type semiconductor substrate 1 has the thickness of about 300 μm and the resistivity of about 1 kΩ·cm. In the present embodiment, a "high impurity concentration" refers to, for example, an impurity concentration of not less than about $1\times10^{17}$ cm$^{-3}$ and is denoted by sign "+" attached to conductivity type. A "low impurity concentration" refers to, for example, an impurity concentration of not more than about $1\times10^{15}$ cm$^{-3}$ and is denoted by sign "−" attached to conductivity type. Examples of n-type impurities include antimony (Sb), arsenic (As), and so on, and examples of p-type impurities include boron (B) and others.

Figure 2:
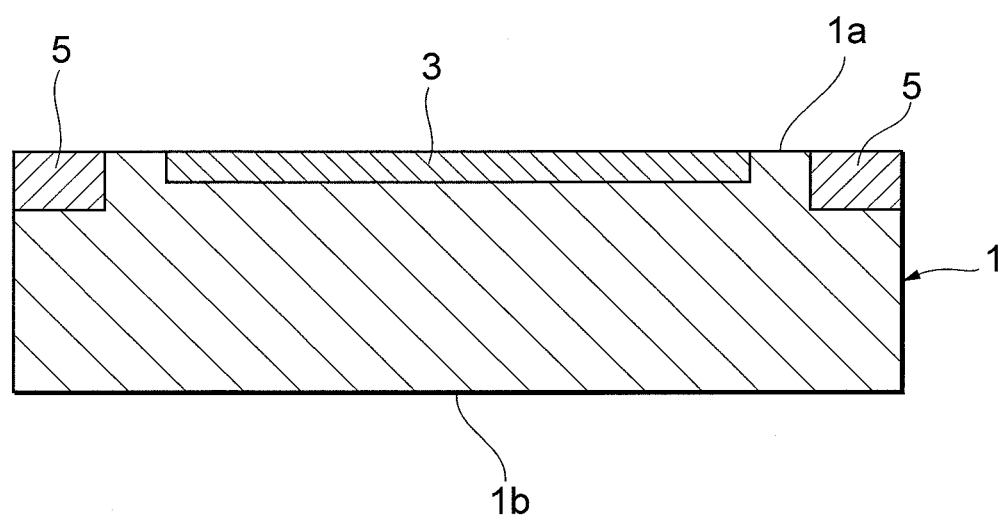
FIG. 2 is a drawing for explaining the manufacturing method of the photodiode according to the first embodiment.

Next, a p⁺ type semiconductor region 3 and an n⁺ type semiconductor region 5 are formed on the first principal surface 1$a$ side of the n⁻ type semiconductor substrate 1 (cf. FIG. 2). The p⁺ type semiconductor region 3 is formed by diffusing a p-type impurity in a high concentration from the first principal surface 1$a$ side in the n⁻ type semiconductor substrate 1, using a mask opening in a central region. The n⁺ type semiconductor region 5 is formed by diffusing an n-type impurity in a higher concentration than in the n⁻ type semiconductor substrate 1, from the first principal surface 1$a$ side in the n⁻ type semiconductor substrate 1 so as to surround the p⁺ type semiconductor region 3, using another mask opening in a peripheral region. The p⁺ type semiconductor region 3 has the thickness of, for example, about 0.55 μm and the sheet resistance of, for example, 44 Ω/sq. The n⁺ type semiconductor region 5 has the thickness of, for example, about 1.5 μm and the sheet resistance of, for example, 12 Ω/sq.

Figure 3:
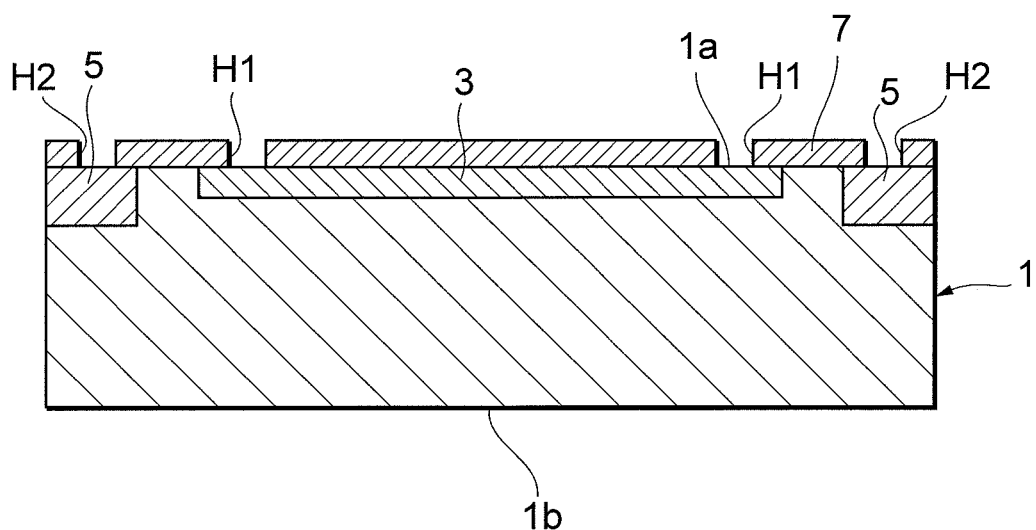
FIG. 3 is a drawing for explaining the manufacturing method of the photodiode according to the first embodiment.

Next, an insulating layer 7 is formed on the first principal surface 1$a$ side of the n⁻ type semiconductor substrate 1 (cf. FIG. 3). The insulating layer 7 is comprised of SiO₂ and is formed by thermal oxidation of the n⁻ type semiconductor substrate 1. The insulating layer 7 has the thickness of, for example, about 0.1 μm. Thereafter, a contact hole H1 is formed in the insulating layer 7 on the p⁺ type semiconductor region 3 and a contact hole H2 is formed in the insulating layer 7 on the n$^+$ type semiconductor region 5. An antireflective (AR) layer comprised of SiN may be formed instead of the insulating layer 7.

Figure 4:
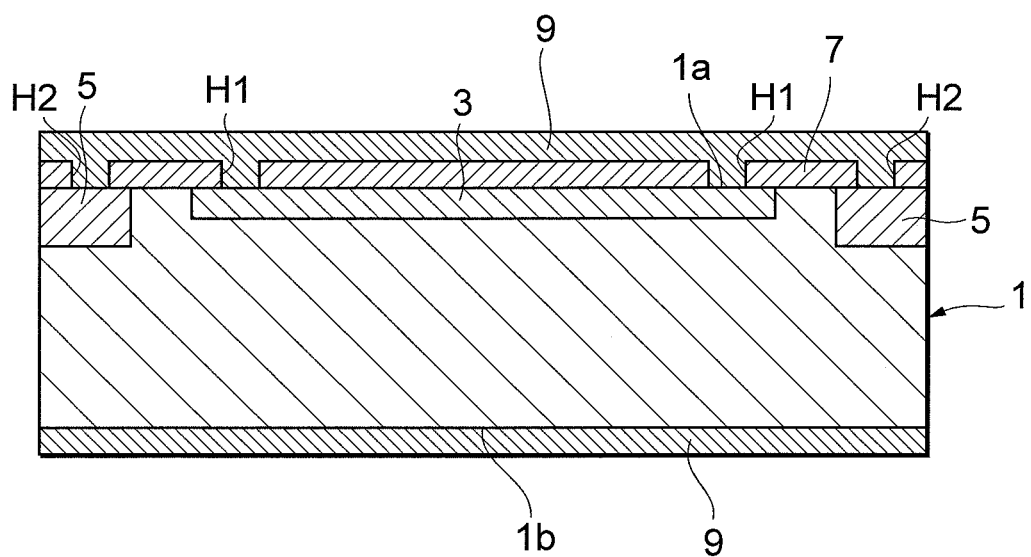
FIG. 4 is a drawing for explaining the manufacturing method of the photodiode according to the first embodiment.
Figure 5:
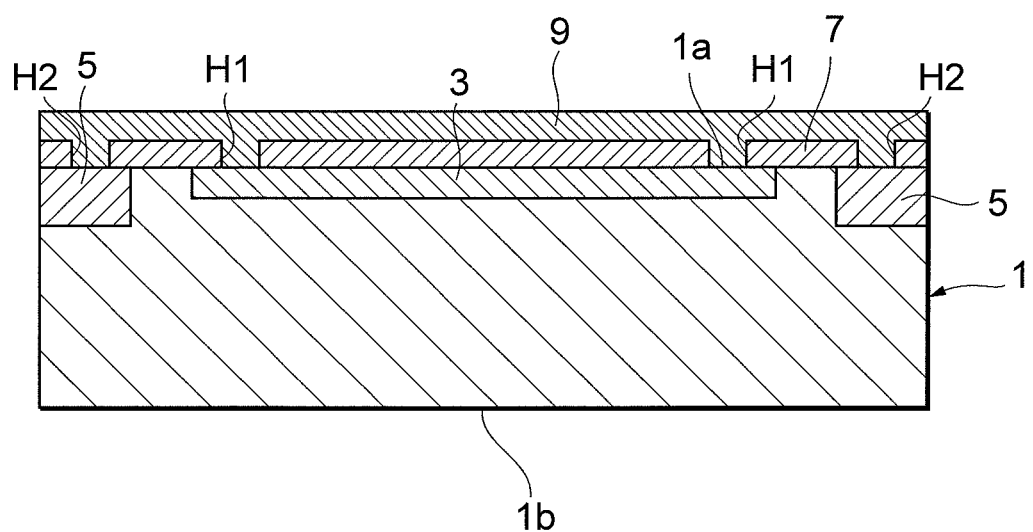
FIG. 5 is a drawing for explaining the manufacturing method of the photodiode according to the first embodiment.

Next, a passivation layer 9 is formed on the second principal surface 1b of the n$^-$ type semiconductor substrate 1 and on the insulating layer 7 (cf. FIG. 4). The passivation layer 9 is comprised of SiN and is formed, for example, by the plasma CVD process. The passivation layer 9 has the thickness of, for example, 0.1 μm. Then the n$^-$ type semiconductor substrate 1 is polished from the second principal surface 1b side before the thickness of the n$^-$ type semiconductor substrate 1 reaches a desired thickness (cf. FIG. 5). This process removes the passivation layer 9 from on the second principal surface 1b of the n$^-$ type semiconductor substrate 1, thereby exposing the n$^-$ type semiconductor substrate 1. A surface exposed by polishing is also referred to herein as the second principal surface 1b. The desired thickness is, for example, 270 μm.

Figure 6:
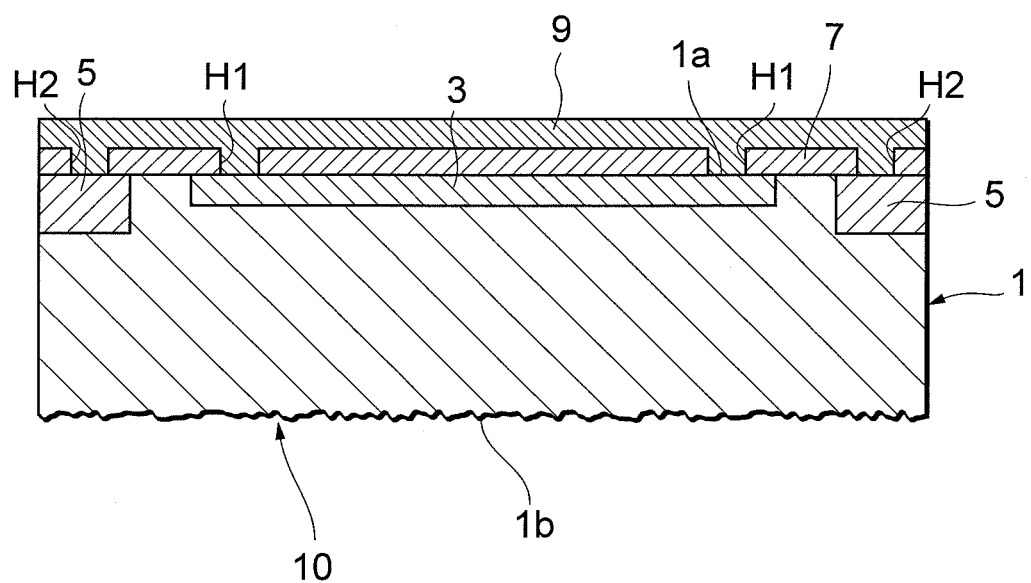
FIG. 6 is a drawing for explaining the manufacturing method of the photodiode according to the first embodiment.
Figure 7:
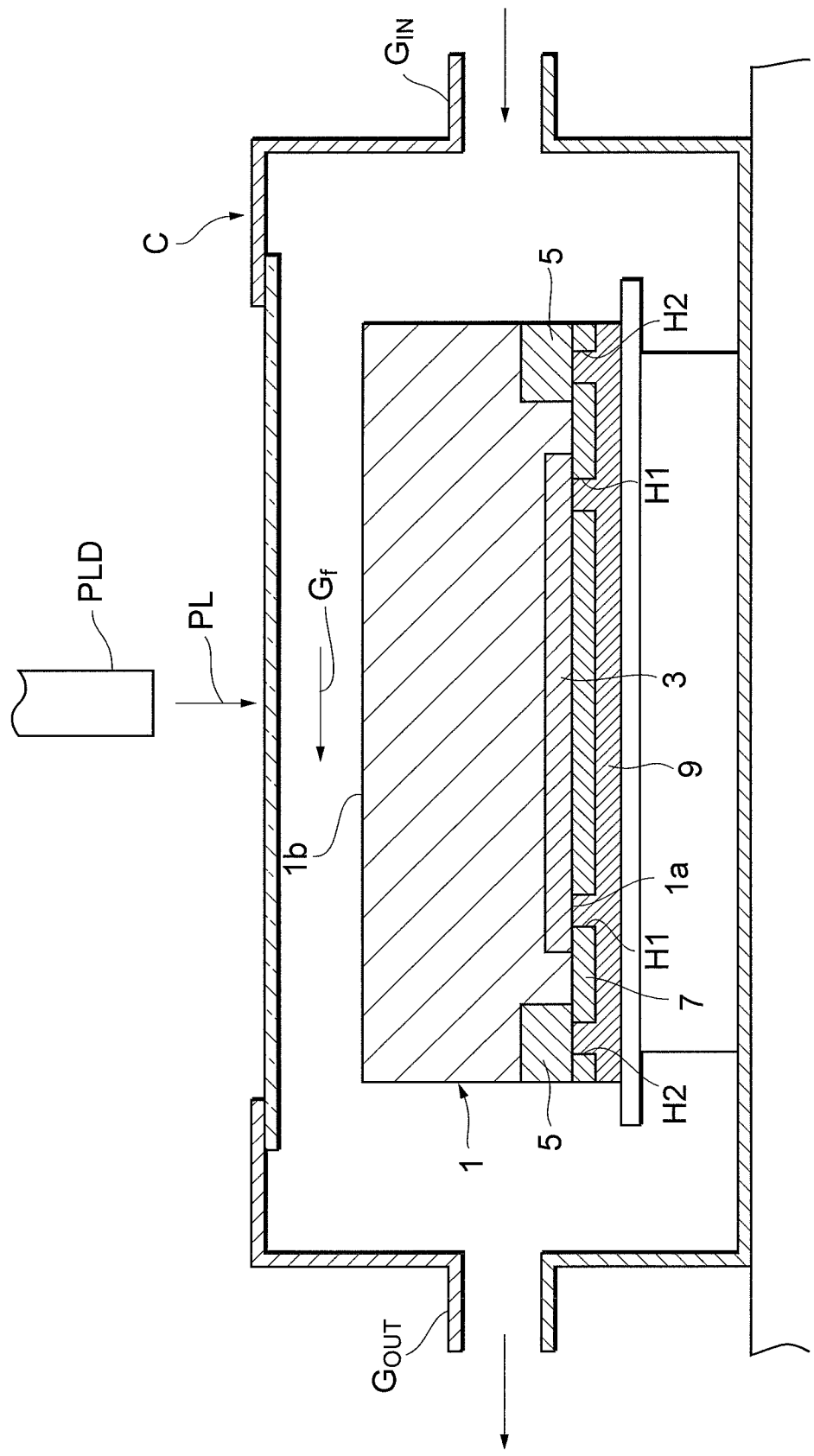
FIG. 7 is a drawing for explaining the manufacturing method of the photodiode according to the first embodiment.

Next, the second principal surface 1b of the n$^-$ type semiconductor substrate 1 is subjected to irradiation with a pulsed laser beam PL, thereby forming an irregular asperity 10 (cf. FIG. 6). In this step, as shown in FIG. 7, the n$^-$ type semiconductor substrate 1 is placed in a chamber C, and the n$^-$ type semiconductor substrate 1 is irradiated with the pulsed laser beam PL from a pulse laser generating device PLD located outside the chamber C. The chamber C has a gas inlet port $G_{IN}$ and a gas outlet port $G_{OUT}$, and an inert gas (e.g., nitrogen gas, argon gas, or the like) is introduced through the gas inlet port $G_{IN}$ and discharged through the gas outlet port $G_{OUT}$, thereby forming an inert gas flow $G_f$ in the chamber C. Dust and other materials made during the irradiation with the pulsed laser beam PL are discharged as trapped into the inert gas flow $G_f$, to the outside of the chamber C, thereby preventing processing debris, dust, and other materials from attaching to the n$^-$ type semiconductor substrate 1.

Figure 8:
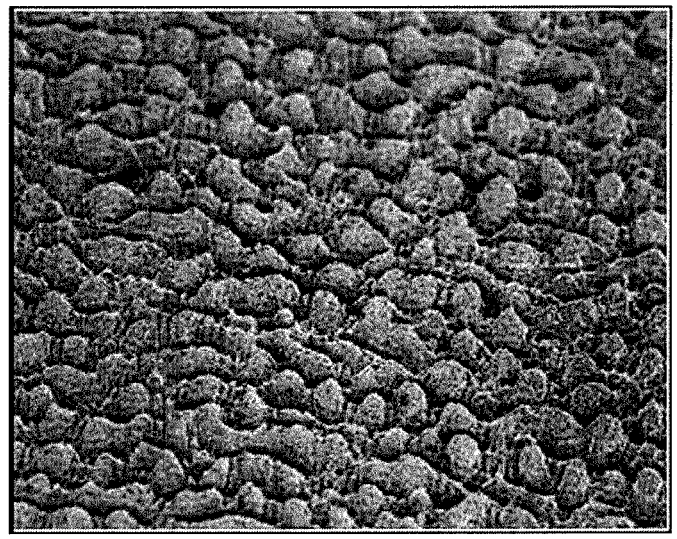
FIG. 8 is a drawing for explaining the manufacturing method of the photodiode according to the first embodiment.

In the present embodiment, the pulse laser generating device PLD to be used is a picosecond to femtosecond pulse laser generating device and a picosecond to femtosecond pulsed laser beam is applied across the entire area of the second principal surface 1b. The second principal surface 1b is roughened by the picosecond to femtosecond pulsed laser beam, whereby the irregular asperity 10 is formed throughout the entire area of the second principal surface 1b, as shown in FIG. 8. The irregular asperity 10 has facets intersecting with a direction perpendicular to the first principal surface 1a. The height difference of asperity 10 is, for example, about 0.5 to 10 μm and the spacing of projections in the asperity 10 is about 0.5 to 10 μm. The picosecond to femtosecond pulsed laser beam has the pulse duration of, for example, about 50 fs-2 ps, the intensity of, for example, about 4 to 16 GW, and the pulse energy of, for example, about 200 to 800 μJ/pulse. More generally, the peak intensity is $3\times10^{11}$ to $2.5\times10^{13}$ (W/cm$^2$) and the fluence is about 0.1 to 1.3 (J/cm$^2$). FIG. 8 is an SEM image resulting from observation of the irregular asperity 10 formed in the second principal surface 1b.

Figure 9:
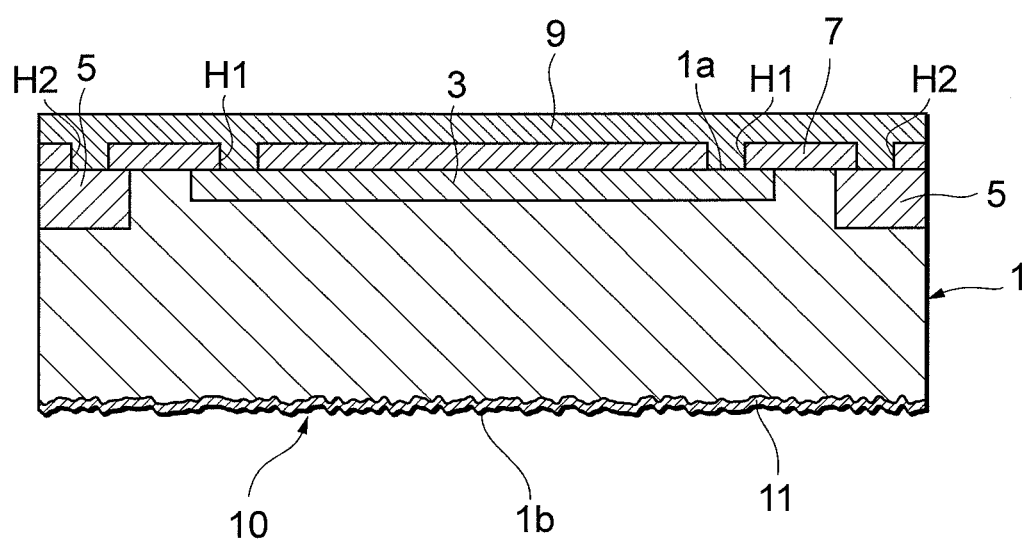
FIG. 9 is a drawing for explaining the manufacturing method of the photodiode according to the first embodiment.

Next, an accumulation layer 11 is formed on the second principal surface 1b side of the n$^-$ type semiconductor substrate 1 (cf. FIG. 9). In this step, the accumulation layer 11 is formed by ion implantation or diffusion of an n-type impurity from the second principal surface 1b side in the n$^-$ type semiconductor substrate 1 so that an impurity concentration thereof becomes higher than that of the n$^-$ type semiconductor substrate 1. The accumulation layer 11 has the thickness of, for example, about 1 μm.

Next, the n$^-$ type semiconductor substrate 1 is subjected to a thermal treatment (annealing). In this step, the n$^-$ type semiconductor substrate 1 is heated, for example, in the temperature range of about 800 to 1000° C. under an ambiance of N$_2$ gas for about 0.5 to 1 hour.

Figure 10:
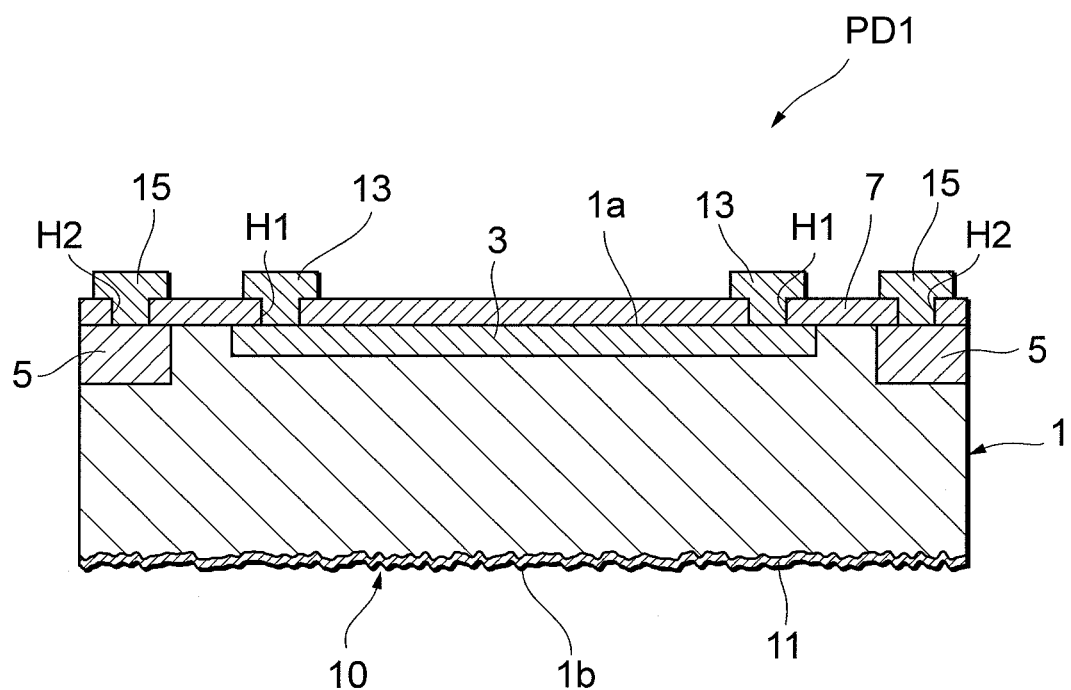
FIG. 10 is a drawing for explaining the manufacturing method of the photodiode according to the first embodiment.

Next, the passivation layer 9 formed on the insulating layer 7 is removed and thereafter electrodes 13, 15 are formed (cf. FIG. 10). The electrode 13 is formed in the contact hole H1 and the electrode 15 in the contact hole H2. The electrodes 13, 15 each are comprised of aluminum (Al) or the like and have the thickness of, for example, about 1 μl. This completes the photodiode PD1.

The photodiode PD1 is provided with the n$^-$ type semiconductor substrate 1, as shown in FIG. 10. The p$^+$ type semiconductor region 3 and the n$^+$ type semiconductor region 5 are formed on the first principal surface 1a side of the n$^-$ type semiconductor substrate 1 and a pn junction is formed between the n$^-$ type semiconductor substrate 1 and the p$^+$ type semiconductor region 3. The electrode 13 is in electrical contact with and connection to the p$^+$ type semiconductor region 3 through the contact hole H1. The electrode 15 is in electrical contact with and connection to the n$^+$ type semiconductor region 5 through the contact hole H2.

The irregular asperity 10 is formed in the second principal surface 1b of the n$^-$ type semiconductor substrate 1. The accumulation layer 11 is formed on the second principal surface 1b side of the n$^-$ type semiconductor substrate 1 and the second principal surface 1b is optically exposed. That the second principal surface 1b is optically exposed encompasses not only the case where the second principal surface 1b is in contact with ambient gas such as air, but also the case where an optically transparent film is formed on the second principal surface 1b.

Figure 11:
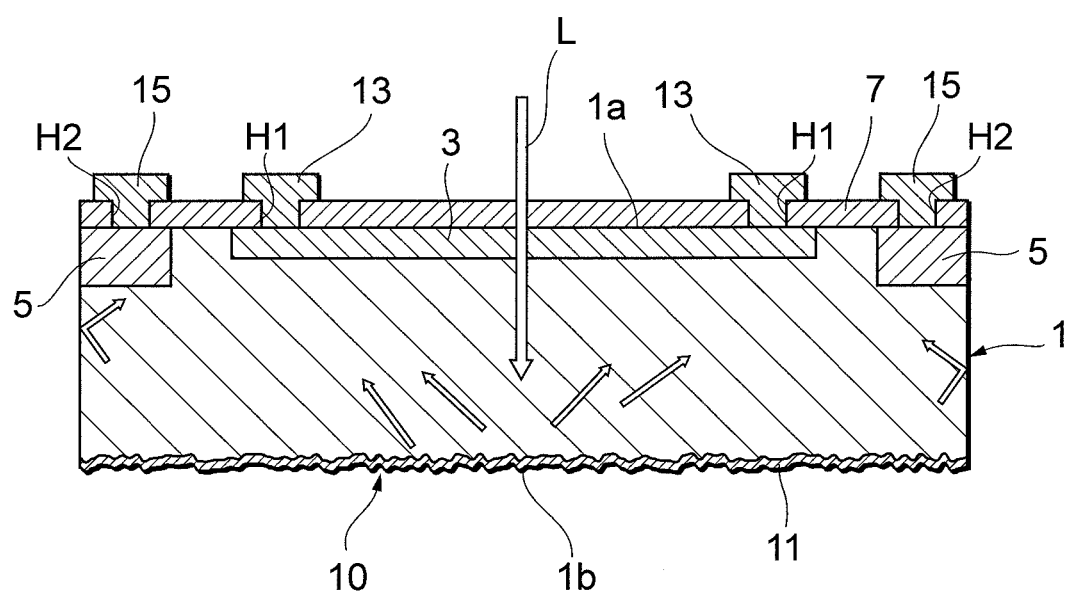
FIG. 11 is a drawing showing a configuration of the photodiode according to the first embodiment.

In the photodiode PD1, the irregular asperity 10 is formed in the second principal surface 1b. For this reason, light L incident into the photodiode PD1 is reflected, scattered, or diffused by the asperity 10, as shown in FIG. 11, to travel through a long distance in the n$^-$ type semiconductor substrate 1.

Normally, Si has the refractive index n=3.5 and air the refractive index n=1.0. In a photodiode, when light is incident from a direction normal to a light incident surface, light remaining unabsorbed in the photodiode (silicon substrate) is separated into a light component reflected on the back surface to the light incident surface and a light component passing through the photodiode. The light passing through the photodiode does not contribute to the sensitivity of the photodiode. The light component reflected on the back surface to the light incident surface, if absorbed in the photodiode, becomes a photocurrent. A light component still remaining unabsorbed is reflected or transmitted by the light incident surface as the light component having reached the back surface to the light incident surface was.

In the photodiode PD1, where light L is incident from the direction normal to the light incident surface (first principal surface 1a), when the light reaches the irregular asperity 10 formed in the second principal surface 1b, light components arriving thereat at angles of not less than 16.6° to a direction of emergence from the asperity 10 are totally reflected by the asperity 10. Since the asperity 10 is formed irregularly, it has various angles to the emergence direction and the totally reflected light components diffuse into various directions. For this reason, the totally reflected light components include light components absorbed inside the n$^-$ type semiconductor substrate 1 and light components arriving at the first principal surface 1a and side faces.

Since the light components arriving at the first principal surface 1a and side faces travel in various directions because of the diffusion on the asperity 10, the light components arriving at the first principal surface 1a and the side faces are extremely highly likely to be totally reflected on the first principal surface 1a and the side faces. The light components totally reflected on the first principal surface 1a and the side faces are repeatedly totally reflected on different faces to further increase their travel distance. The light L incident into the photodiode PD1 is absorbed in the n⁻ type semiconductor substrate 1 during travel through the long distance inside the n⁻ type semiconductor substrate 1 to be detected as a photocurrent.

The light L incident into the photodiode PD1 mostly travels, without being transmitted by the photodiode PD1, through the long travel distance to be absorbed in the n⁻ type semiconductor substrate 1. Therefore, the photodiode PD1 is improved in the spectral sensitivity characteristic in the near-infrared wavelength band.

If a regular asperity is formed in the second principal surface 1b, the light components arriving at the first principal surface 1a and the side faces are diffused by the asperity but travel in uniform directions, and, therefore, the light components arriving at the first principal surface 1a and the side faces are less likely to be totally reflected on the first principal surface 1a and the side faces. This results in increase in light passing through the first principal surface 1a and the side faces, and through the second principal surface 1b, and thus the travel distance of the light incident into the photodiode must be short. Accordingly, it becomes difficult to improve the spectral sensitivity characteristic in the near-infrared wavelength band.

An experiment was conducted in order to check the effect of improvement in the spectral sensitivity characteristic in the near-infrared wavelength band by the first embodiment.

We fabricated a photodiode with the above-described configuration (referred to as Example 1) and a photodiode without the irregular asperity in the second principal surface of the n⁻ type semiconductor substrate (referred to as Comparative Example 1), and investigated their spectral sensitivity characteristics. Example 1 and Comparative Example 1 have the same configuration, except for the formation of the irregular asperity by irradiation with the pulsed laser beam. The size of the n⁻ type semiconductor substrate 1 was set to 6.5 mm×6.5 mm. The size of the p⁺ type semiconductor region 3, or a photosensitive region was set to 5.8 mm×5.8 mm. A bias voltage VR applied to the photodiodes was set to 0 V.

Figure 12:
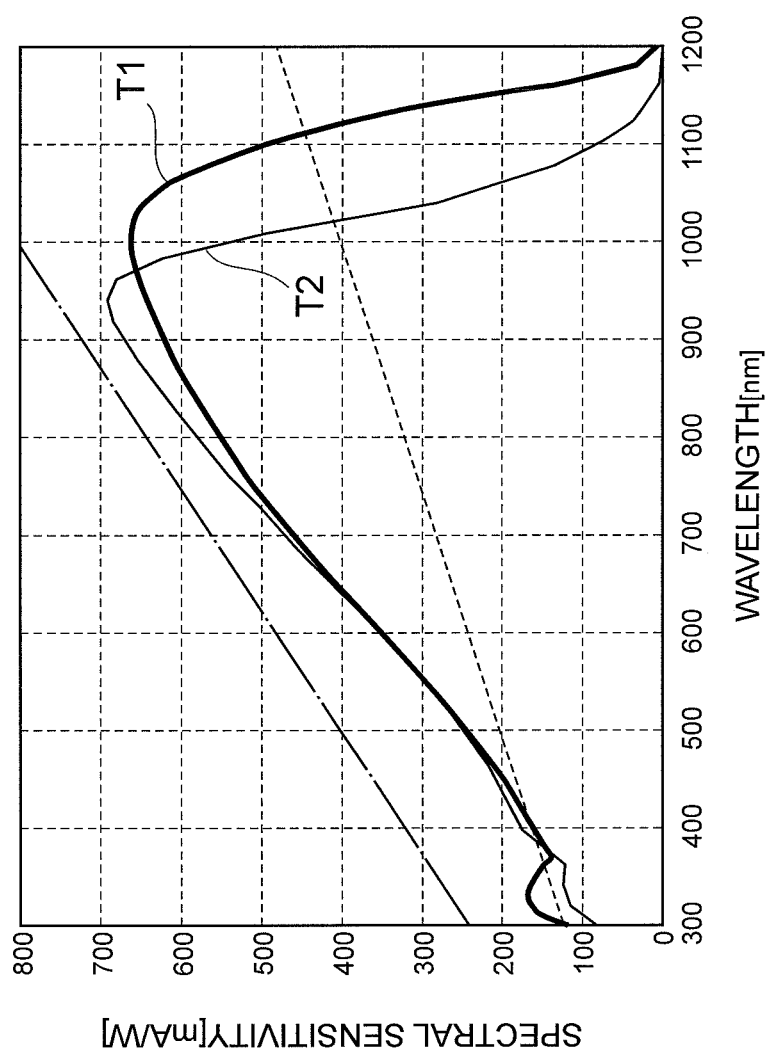
FIG. 12 is a diagram showing changes of spectral sensitivity versus wavelength in Example 1 and Comparative Example 1.

The results are shown in FIG. 12. In FIG. 12, the spectral sensitivity characteristic of Example 1 is represented by T1 and the spectral sensitivity characteristic of Comparative Example 1 by characteristic T2. In FIG. 12, the vertical axis represents the spectral sensitivity (mA/W) and the horizontal axis the wavelength of light (nm). A characteristic indicated by a chain line represents a spectral sensitivity characteristic where the quantum efficiency (QE) is 100%, and a characteristic indicated by a dashed line, a spectral sensitivity characteristic where the quantum efficiency is 50%.

As seen from FIG. 12, for example at 1064 nm, the spectral sensitivity in Comparative Example 1 is 0.2 A/W (QE=25%) whereas the spectral sensitivity in Example 1 is 0.6 A/W (QE=72%); thus the spectral sensitivity in the near-infrared wavelength band is drastically improved.

Figure 13:
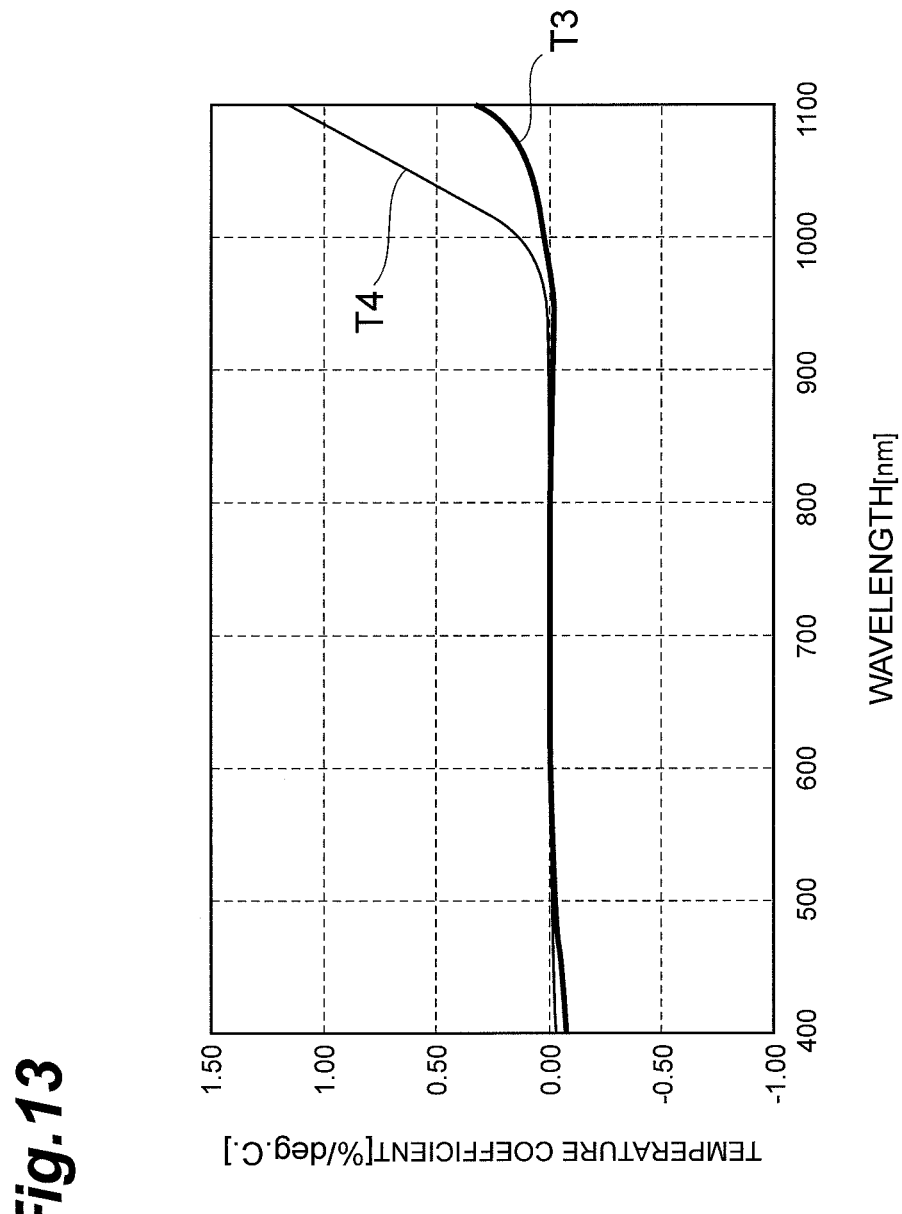
FIG. 13 is a diagram showing changes of temperature coefficient versus wavelength in Example 1 and Comparative Example 1.

We also checked temperature characteristics of spectral sensitivity in Example 1 and Comparative Example 1. We investigated the spectral sensitivity characteristics with increase in ambient temperature from 25° C. to 60° C. and calculated a rate (temperature coefficient) of spectral sensitivity at 60° C. to spectral sensitivity at 25° C. The results are shown in FIG. 13. In FIG. 13, the characteristic of temperature coefficient of Example 1 is represented by T3 and that of Comparative Example 1 by characteristic T4. In FIG. 13, the vertical axis represents the temperature coefficient (%/° C.) and the horizontal axis the wavelength of light (nm).

As seen from FIG. 13, for example at 1064 nm, the temperature coefficient in Comparative Example 1 is 0.7%/° C., whereas the temperature coefficient in Example 1 is 0.2%/° C., demonstrating lower temperature dependence. In general, an increase in temperature leads to an increase in spectral sensitivity because of increase in absorption coefficient and decrease in bandgap energy. In Example 1, since the spectral sensitivity is sufficiently high even at room temperature, the change of spectral sensitivity due to temperature rise is smaller than in Comparative Example 1.

In the photodiode PD1, the accumulation layer 11 is formed on the second principal surface 1b side of the n⁻ type semiconductor substrate 1. This induces recombination of unnecessary carriers generated independent of light on the second principal surface 1b side, which can reduce dark current. The accumulation layer 11 prevents carriers generated by light near the second principal surface 1b, from being trapped in the second principal surface 1b. For this reason, the carriers generated by light efficiently migrate to the pn junction, which can further improve the photodetection sensitivity of the photodiode PD1.

In the first embodiment, after the formation of the accumulation layer 11, the n⁻ type semiconductor substrate 1 is subjected to the thermal treatment. This treatment restores the crystallinity of the n⁻ type semiconductor substrate 1, which can prevent such a problem as increase of dark current.

In the first embodiment, after the thermal treatment of the n⁻ type semiconductor substrate 1, the electrodes 13, 15 are formed. This prevents the electrodes 13, 15 from melting during the thermal treatment, even in the case where the electrodes 13, 15 are made of a metal with a relatively low melting point. Therefore, the electrodes 13, 15 can be appropriately formed without being affected by the thermal treatment.

In the first embodiment, the irregular asperity 10 is formed by the irradiation with the picosecond to femtosecond pulsed laser beam. This permits the irregular asperity 10 to be appropriately and readily formed.

Second Embodiment

Figure 14:
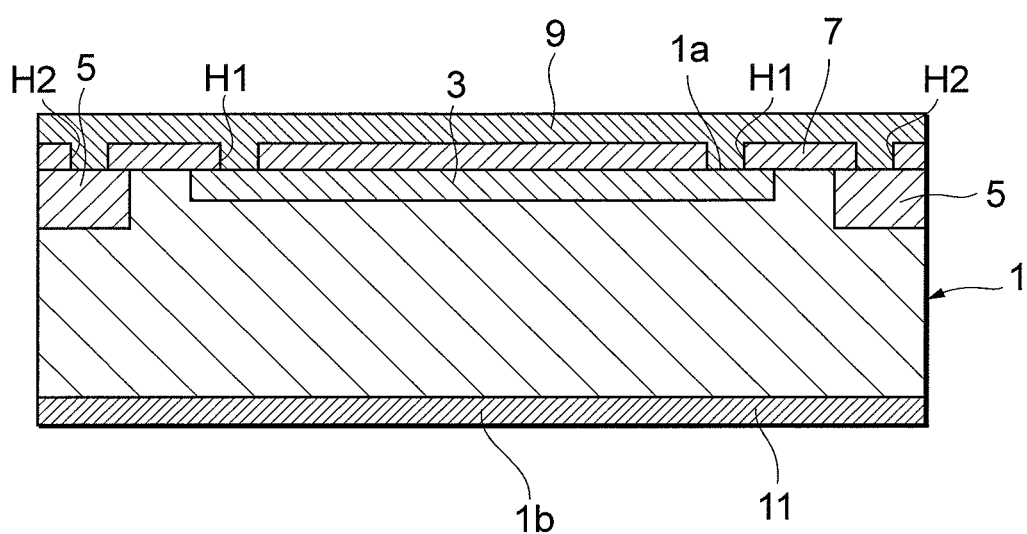
FIG. 14 is a drawing for explaining a manufacturing method of a photodiode according to the second embodiment.
Figure 15:
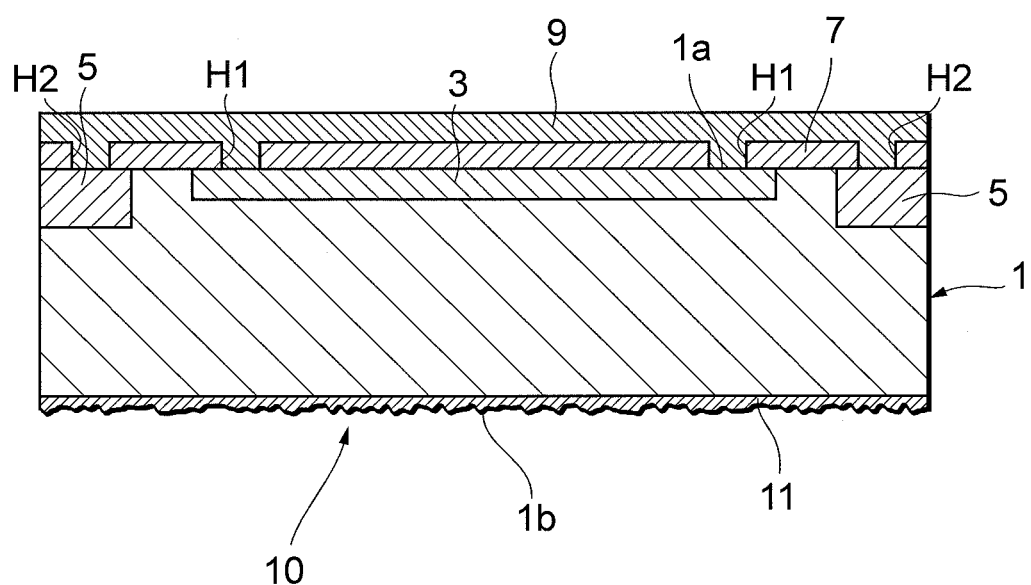
FIG. 15 is a drawing for explaining the manufacturing method of the photodiode according to the second embodiment.
Figure 16:
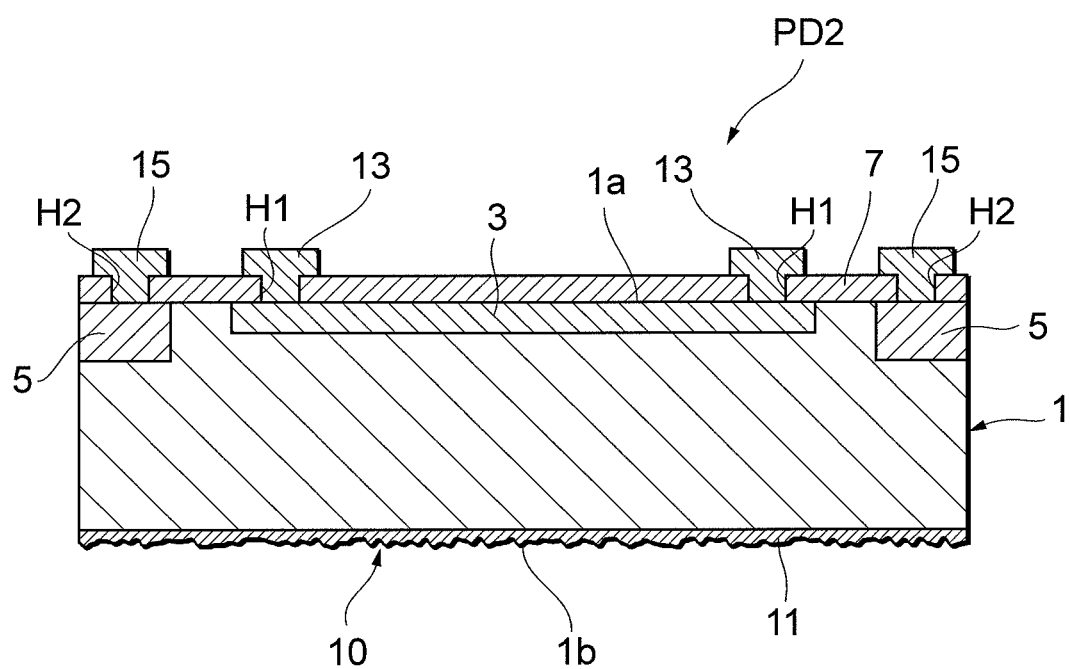
FIG. 16 is a drawing for explaining the manufacturing method of the photodiode according to the second embodiment.
Figure 17:
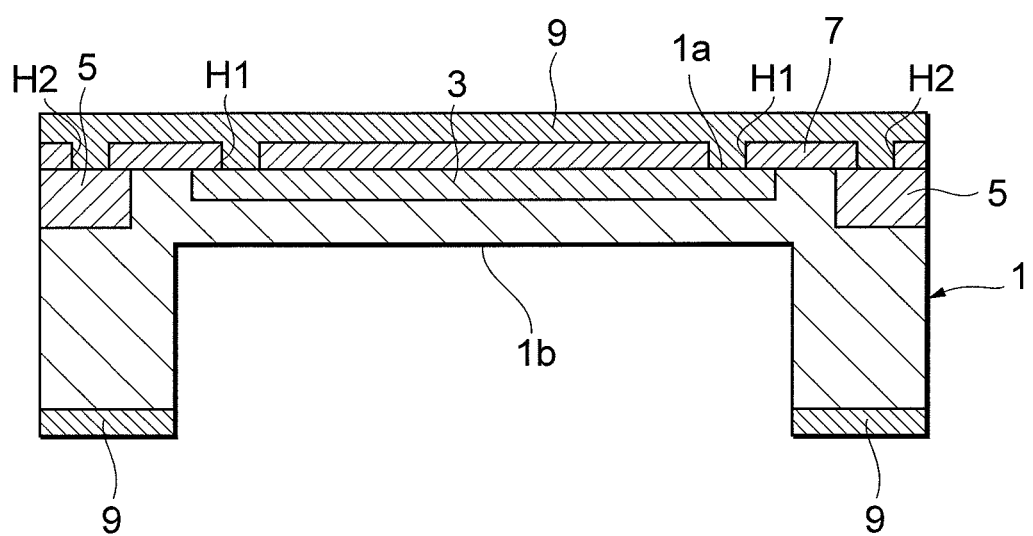
FIG. 17 is a drawing for explaining a manufacturing method of a photodiode according to the third embodiment.

A method for manufacturing a photodiode according to the second embodiment will be described with reference to FIGS. 14 to 16. FIGS. 14 to 16 are drawings for explaining the manufacturing method of the photodiode according to the second embodiment.

The manufacturing method of the second embodiment, up to the polishing of the n⁻ type semiconductor substrate 1 from the second principal surface 1b side, is the same as the manufacturing method of the first embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the n⁻ type semiconductor substrate 1 (cf. FIG. 14). The formation of the accumulation layer 11 is carried out in the same manner as in the first embodiment. The accumulation layer 11 has the thickness of, for example, about 1 μm.

Next, the second principal surface 1b of the n⁻ type semiconductor substrate 1 is irradiated with the pulsed laser beam PL to form the irregular asperity 10 (cf. FIG. 15). The formation of the irregular asperity 10 is carried out in the same manner as in the first embodiment.

Next, as in the first embodiment, the n⁻ type semiconductor substrate 1 is subjected to a thermal treatment. Thereafter, the passivation layer 9 formed on the insulating layer 7 is removed and then the electrodes 13, 15 are formed (cf. FIG. 16). This completes the photodiode PD2.

In the second embodiment, as in the first embodiment, the travel distance of light incident into the photodiode PD2 also becomes long and the distance of absorption of light also becomes long. This allows the photodiode PD2 also to be improved in the spectral sensitivity characteristic in the near-infrared wavelength band.

In the second embodiment, the thickness of the accumulation layer 11 is larger than the height difference of the irregular asperity 10. For this reason, even if the irregular asperity 10 is formed by the irradiation with the pulsed laser beam after the formation of the accumulation layer 11, the accumulation layer 11 remains with certainty. Therefore, it is feasible to ensure the operational effect by the accumulation layer 11.

Third Embodiment

A method for manufacturing a photodiode according to the third embodiment will be described with reference to FIGS. 17 to 21. FIGS. 17 to 21 are drawings for explaining the manufacturing method of the photodiode according to the third embodiment.

The manufacturing method of the third embodiment, up to the formation of the passivation layer 9, is the same as the manufacturing method of the first embodiment, and the description of the previous steps before it is omitted herein. After the formation of the passivation layer 9, a portion corresponding to the p⁺ type semiconductor region 3 in the n⁻ type semiconductor substrate 1 is thinned from the second principal surface 1b side while leaving a surrounding region around the thinned portion (cf. FIG. 17). The thinning of the n⁻ type semiconductor substrate 1 is carried out, for example, by anisotropic etching based on alkali etching using a potassium hydroxide solution, TMAH (tetramethylammonium hydroxide solution), or the like. The thinned portion of the n⁻ type semiconductor substrate 1 has the thickness of, for example, about 100 μm, and the surrounding region around it has the thickness of, for example, about 300 μm.

Figure 18:
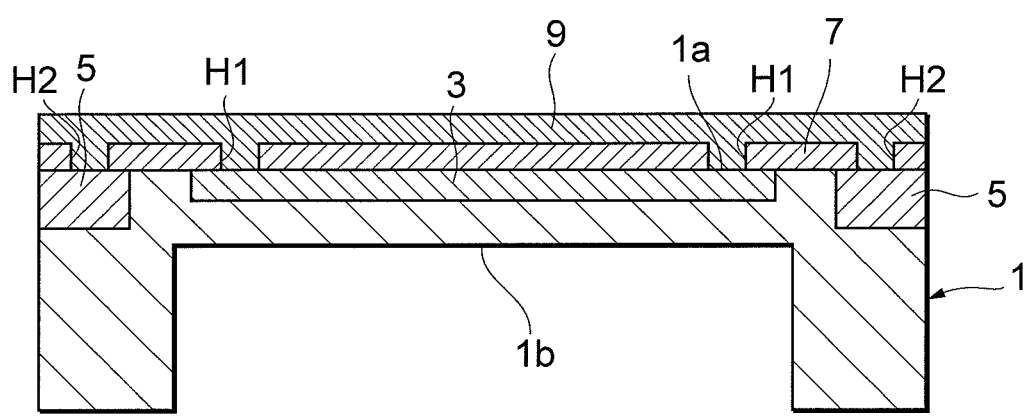
FIG. 18 is a drawing for explaining the manufacturing method of the photodiode according to the third embodiment.

Next, the n⁻ type semiconductor substrate 1 is polished from the second principal surface 1b side before the thickness of the surrounding region of the n⁻ type semiconductor substrate 1 reaches a desired thickness (cf. FIG. 18). The desired thickness herein is, for example, 270 μm.

Figure 19:
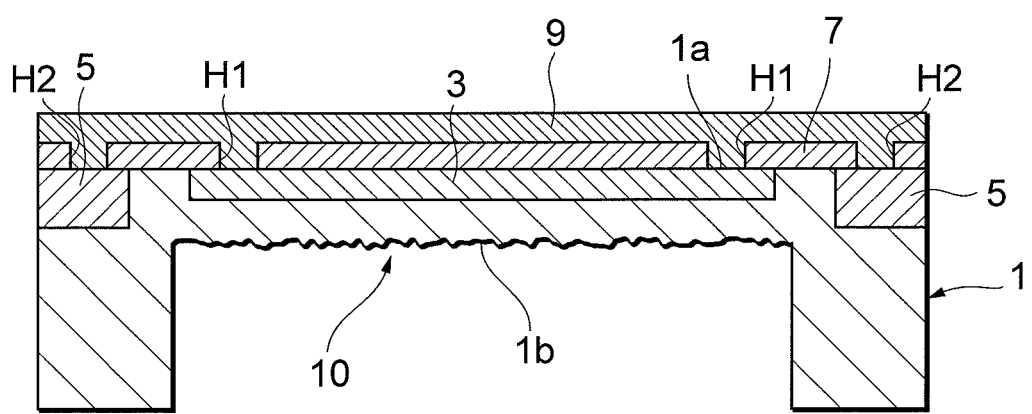
FIG. 19 is a drawing for explaining the manufacturing method of the photodiode according to the third embodiment.

Next, the second principal surface 1b of the n⁻ type semiconductor substrate 1 is irradiated with the pulsed laser beam PL to form the irregular asperity 10 (cf. FIG. 19). The formation of the irregular asperity 10 is carried out in the same manner as in the first embodiment.

Figure 20:
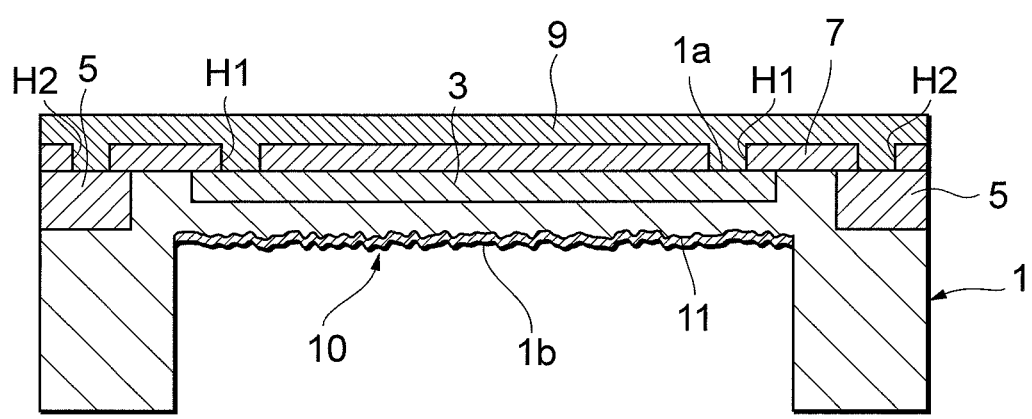
FIG. 20 is a drawing for explaining the manufacturing method of the photodiode according to the third embodiment.

Next, the accumulation layer 11 is formed on the second principal surface 1b side of the thinned portion of the n⁻ type semiconductor substrate 1 (cf. FIG. 20). The formation of the accumulation layer 11 is carried out in the same manner as in the first embodiment. The accumulation layer 11 has the thickness of, for example, about 3 μm.

Figure 21:
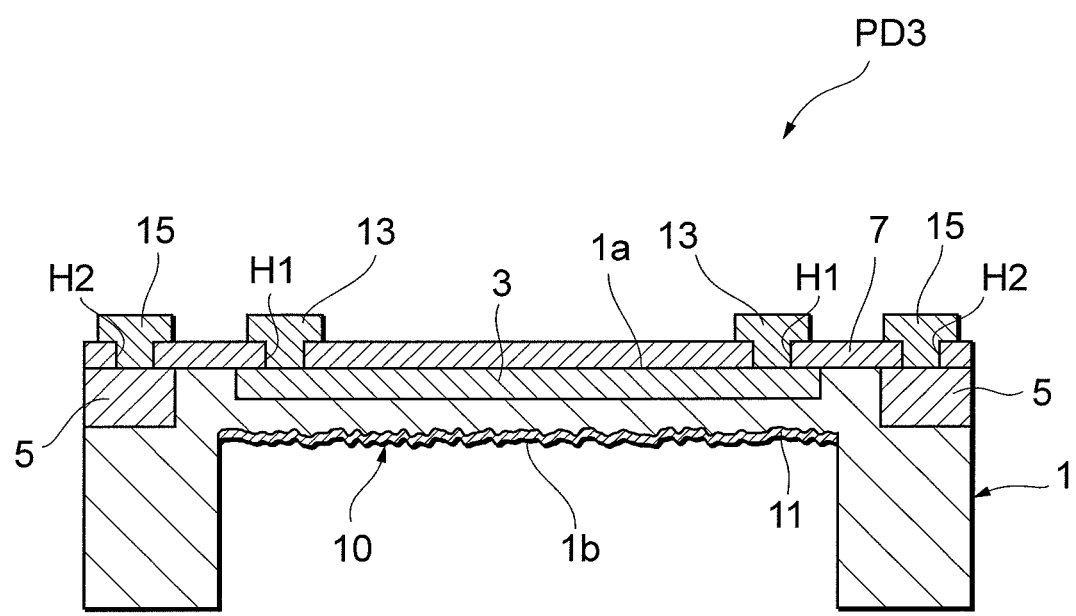
FIG. 21 is a drawing for explaining the manufacturing method of the photodiode according to the third embodiment.

Next, as in the first embodiment, the n⁻ type semiconductor substrate 1 is subjected to a thermal treatment and thereafter, the passivation layer 9 formed on the insulating layer 7 is removed, followed by formation of the electrodes 13, 15 (cf. FIG. 21). This completes the photodiode PD3.

In the third embodiment, as in the first and second embodiments, the travel distance of light incident into the photodiode PD3 also becomes long and the distance of absorption of light also becomes long. This allows the photodiode PD3 also to be improved in the spectral sensitivity characteristic in the near-infrared wavelength band.

In the third embodiment, prior to the formation of the irregular asperity 10, the portion corresponding to the p⁺ type semiconductor region 3 in the n⁻ type semiconductor substrate 1 is thinned from the second principal surface 1b side while leaving the surrounding region around the thinned portion. This permits the photodiode PD3 to be formed with respective light incident surfaces on the first principal surface 1a and the second principal surface 1b sides of the n⁻ type semiconductor substrate 1.

Fourth Embodiment

Figure 22:
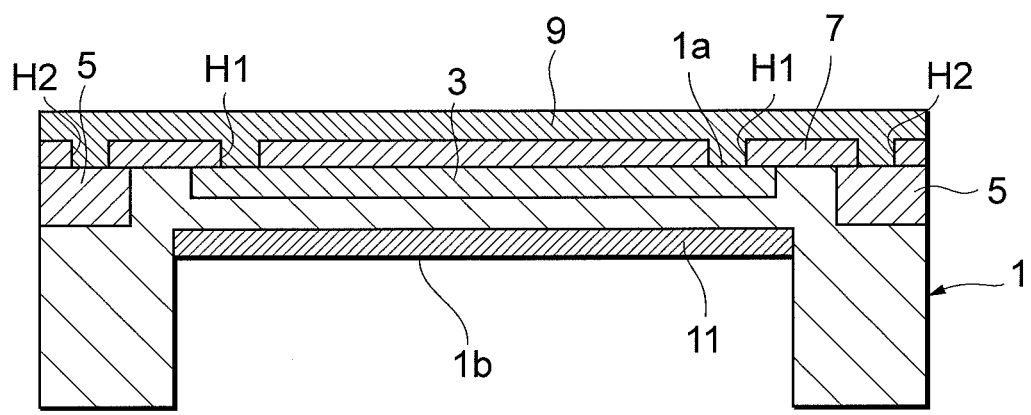
FIG. 22 is a drawing for explaining a manufacturing method of a photodiode according to the fourth embodiment.
Figure 23:
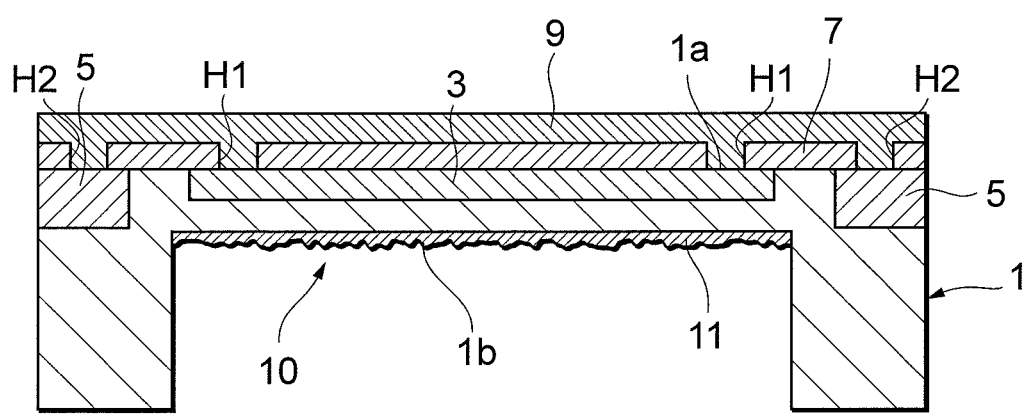
FIG. 23 is a drawing for explaining the manufacturing method of the photodiode according to the fourth embodiment.
Figure 24:
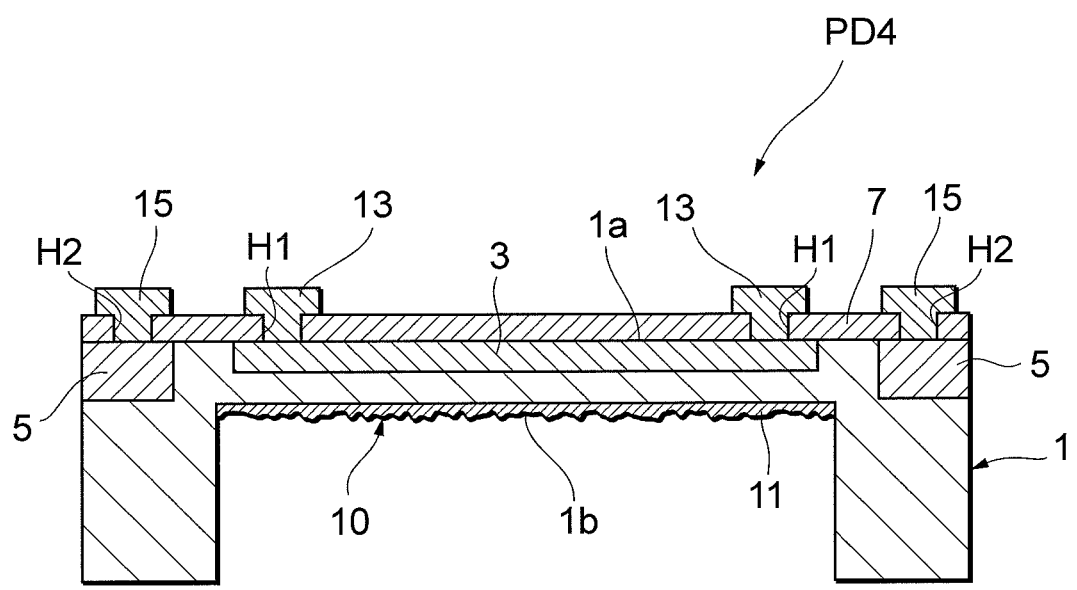
FIG. 24 is a drawing for explaining the manufacturing method of the photodiode according to the fourth embodiment.

A method for manufacturing a photodiode according to the fourth embodiment will be described with reference to FIGS. 22 to 24. FIGS. 22 to 24 are drawings for explaining the manufacturing method of the photodiode according to the fourth embodiment.

The manufacturing method of the fourth embodiment, up to the thinning of the n⁻ type semiconductor substrate 1, is the same as the manufacturing method of the third embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the thinned portion of the n⁻ type semiconductor substrate 1 (cf. FIG. 22). The formation of the accumulation layer 11 is carried out in the same manner as in the first embodiment. The accumulation layer 11 has the thickness of, for example, about 3 μm.

Next, the second principal surface 1b of the n⁻ type semiconductor substrate 1 is irradiated with the pulsed laser beam PL to form the irregular asperity 10 (cf. FIG. 23). The formation of the irregular asperity 10 is carried out in the same manner as in the first embodiment.

Next, the n⁻ type semiconductor substrate 1 is subjected to a thermal treatment as in the first embodiment. Then the passivation layer 9 formed on the insulating layer 7 is removed and thereafter, the electrodes 13, 15 are formed (cf. FIG. 24). This completes the photodiode PD4.

In the fourth embodiment, as in the first to third embodiments, the travel distance of light incident into the photodiode PD4 also becomes long and the distance of absorption of light also becomes long. This allows the photodiode PD4 also to be improved in the spectral sensitivity characteristic in the near-infrared wavelength band.

In the fourth embodiment, prior to the formation of the accumulation layer 11, the portion corresponding to the p⁺ type semiconductor region 3 in the n⁻ type semiconductor substrate 1 is thinned from the second principal surface 1b side while leaving the surrounding region around the thinned portion. This permits the photodiode PD4 to be formed with respective light incident surfaces on the first principal surface 1a and the second principal surface 1b sides of the n⁻ type semiconductor substrate 1.

Fifth Embodiment

Figure 25:
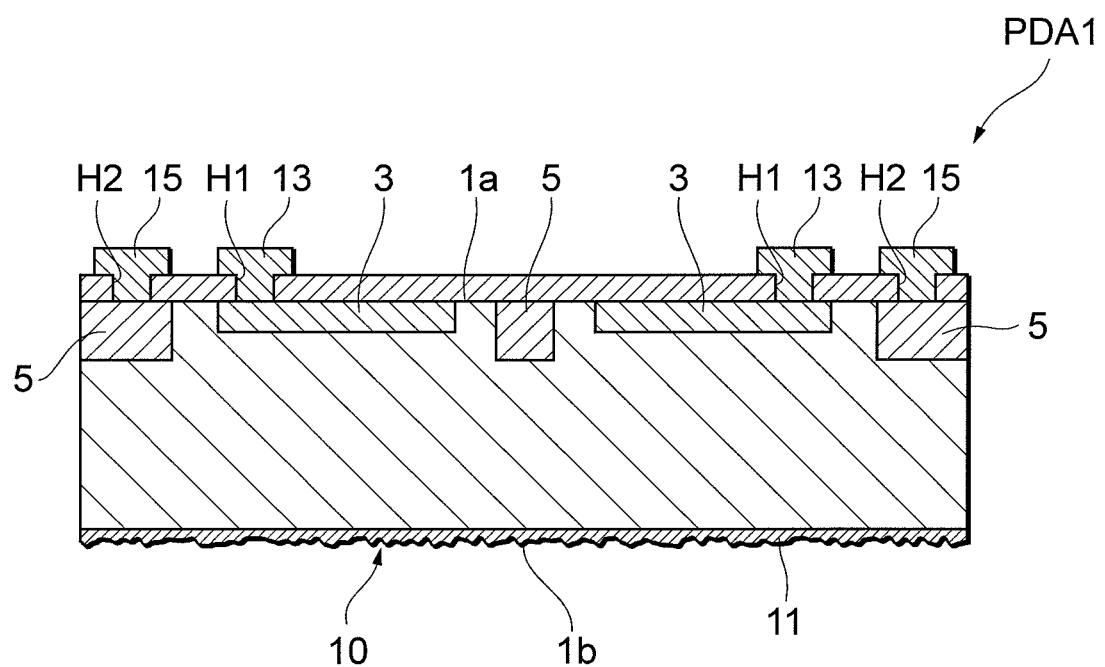
FIG. 25 is a drawing for explaining a configuration of a photodiode array according to the fifth embodiment.

A photodiode array PDA1 according to the fifth embodiment will be described with reference to FIG. 25. FIG. 25 is a drawing for explaining a configuration of the photodiode array according to the fifth embodiment.

The photodiode array PDA1 is provided with an n⁻ type semiconductor substrate 1. A plurality of p⁺ type semiconductor regions 3 are formed on the first principal surface 1a side of the n⁻ type semiconductor substrate 1 and a pn junction is created between the n⁻ type semiconductor substrate 1 and each p⁺ type semiconductor region 3. The irregular asperity 10 is formed in the second principal surface 1b of the n⁻ type semiconductor substrate 1. The accumulation layer 11 is formed on the second principal surface 1b side and the second principal surface 1b is optically exposed. In the photodiode array PDA1, since the irregular asperity 10 is formed in the second principal surface 1b, light incident into the photodiode array PDA1 is reflected, scattered, or diffused by the asperity 10 to travel through a long distance in the n⁻ type semiconductor substrate 1.

In the fifth embodiment, as in the first to fourth embodiments, the travel distance of light incident into the photodiode array PDA1 becomes long and the distance of absorption of light also becomes long. This allows the photodiode array PDA1 also to be improved in the spectral sensitivity characteristic in the near-infrared wavelength band.

In the photodiode array PDA1, the accumulation layer 11 is formed on the second principal surface 1b side of the n⁻ type semiconductor substrate 1. This induces recombination of unnecessary carriers generated independent of light on the second principal surface 1b side, so as to reduce the dark current. The accumulation layer 11 prevents carriers generated by light near the second principal surface 1b, from being trapped in the second principal surface 1b. For this reason, the carriers generated by light can efficiently migrate to the pn junctions so as to further improve the photodetection sensitivity of the photodiode array PDA 1.

In the photodiode array PDA1, the irregular asperity 10 is also formed in regions opposed to the regions between the p⁺ type semiconductor regions 3 (pn junctions) in the second principal surface 1b. For this reason, light incident into the regions between the p⁺ type semiconductor regions 3 is reflected, scattered, or diffused by the irregular asperity 10 formed in the regions opposed to the regions between the p⁺ type semiconductor regions 3 in the second principal surface 1b, to be certainly absorbed in the n⁻ type semiconductor substrate 1. Therefore, the photodiode array PDA1 is improved in the photodetection sensitivity, without reduction in detection sensitivity in the regions between the p⁺ type semiconductor regions 3.

Sixth Embodiment

Figure 26:
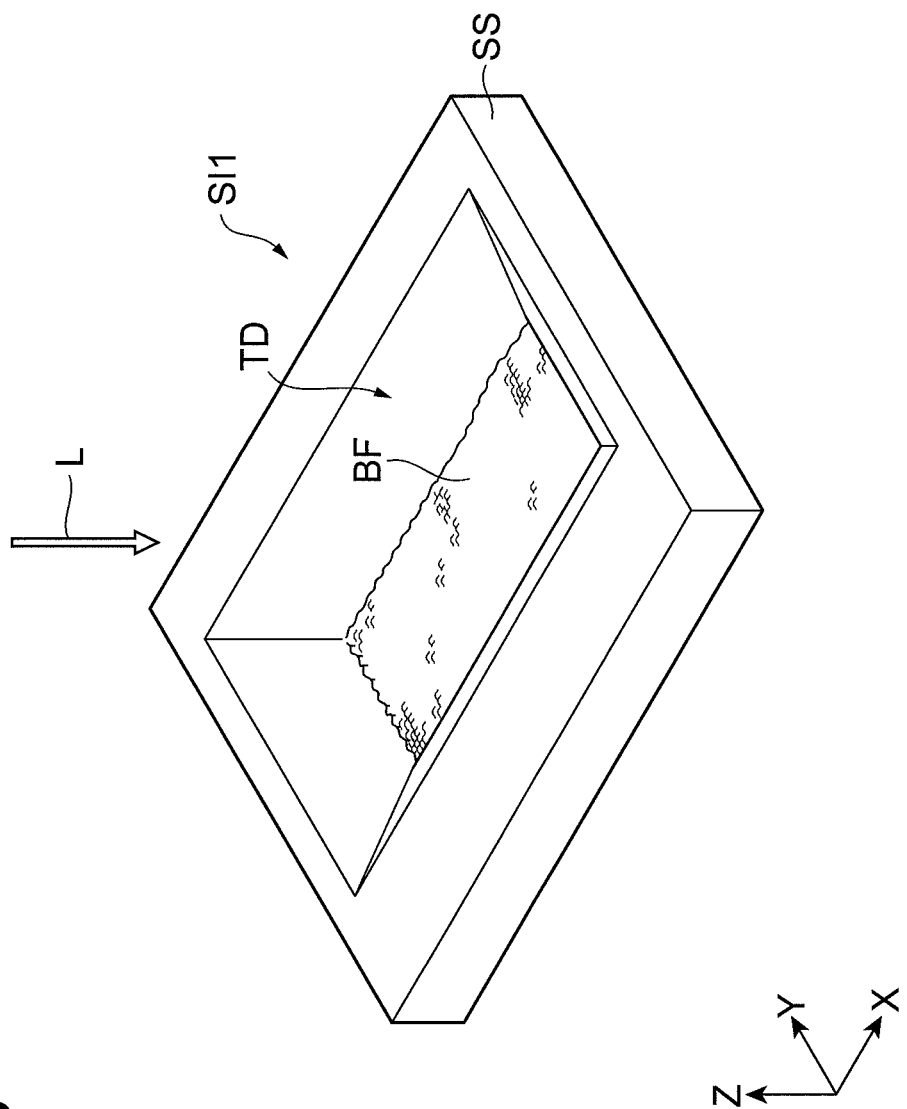
FIG. 26 is a perspective view showing a semiconductor light-detecting element according to the sixth embodiment.
Figure 27:
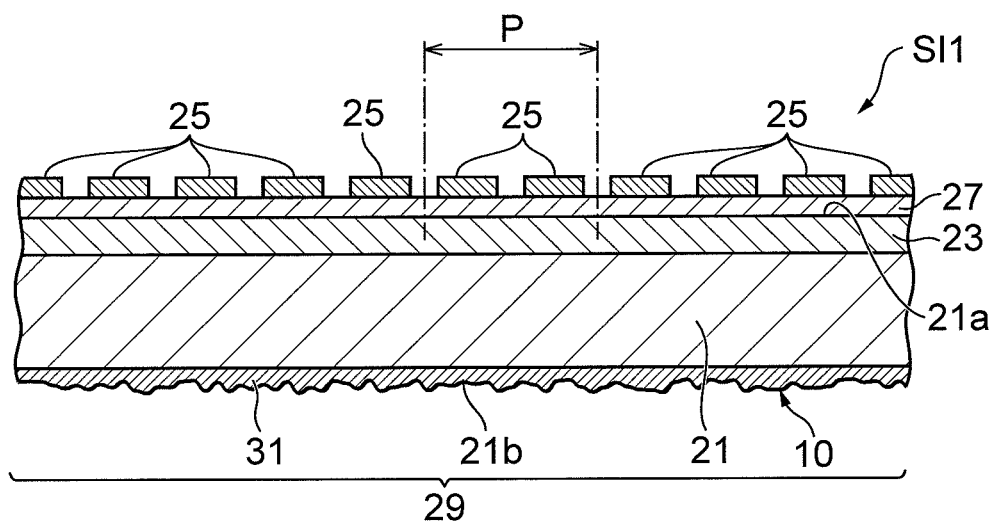
FIG. 27 is a drawing for explaining a cross-sectional configuration of the semiconductor light-detecting element according to the sixth embodiment.

A solid-state imaging device SI1 according to the sixth embodiment will be described with reference to FIGS. 26 and 27. FIG. 26 is a perspective view showing the solid-state imaging device according to the sixth embodiment. FIG. 27 is a drawing for explaining a cross-sectional configuration of the solid-state imaging device according to the sixth embodiment.

The solid-state imaging device SI1, as shown in FIG. 26, is a back-thinned type solid-state imaging device and BT-CCD (charged coupled device) obtained by thinning the back side of a semiconductor substrate SS by etching with a KOH aqueous solution or the like. A recess TD is formed in a central region of the etched semiconductor substrate SS and a thick frame portion exists around the recess TD. Side faces of the recess TD are inclined at obtuse angles relative to a bottom face BF. The thinned central region of the semiconductor substrate SS is a photosensitive region (imaging region) and light L is incident along the negative direction of Z-axis in this photosensitive region. The bottom face BF of the recess TD of the semiconductor substrate SS constitutes a light incident surface. The frame portion may be removed by etching, whereby the solid-state imaging device SI1 is modified into a back-thinned type solid-state imaging device the entire region of which is thinned.

The solid-state imaging device SI1 is provided with a p-type semiconductor substrate 21 as the foregoing semiconductor substrate SS. The p-type semiconductor substrate 21 is comprised of silicon (Si) crystal and has a first principal surface 21a and a second principal surface 21b opposed to each other. The p-type semiconductor substrate 21 has the thickness set to not more than the pixel pitch P. In the present embodiment, the pixel pitch P is about 10 to 48 μm and the thickness of the p-type semiconductor substrate 21 is about 10 to 30 μm. The present embodiment shows an example of two-phase clock driving and under each transfer electrode, there are regions of different impurity concentrations (not shown) in order to ensure unidirectional transfer of charge.

An n-type semiconductor layer 23 as a charge transfer part is formed on the first principal surface 21a side of the p-type semiconductor substrate 21, and therefore a pn junction is formed between the p-type semiconductor substrate 21 and the n-type semiconductor layer 23. A plurality of charge transfer electrodes 25 as a transfer electrode part are provided through an insulating layer 27 on the first principal surface 21a of the p-type semiconductor substrate 21. On the first principal surface 21a side of the p-type semiconductor substrate 21, isolation regions for electrically separating the n-type semiconductor layer 23 into regions for respective vertical CCDs are also formed though not shown. The n-type semiconductor layer 23 has the thickness of about 0.5 μm.

The irregular asperity 10 is formed throughout the entire photosensitive region 29 in the second principal surface 21b of the p-type semiconductor substrate 21. An accumulation layer 31 is formed on the second principal surface 21b side of the p-type semiconductor substrate 21 and the second principal surface 21b is optically exposed. That the second principal surface 21b is optically exposed embraces not only the case where the second principal surface 21b is in contact with ambient gas such as air, but also the case where an optically transparent film is formed on the second principal surface 21b. When the solid-state imaging device SI1 is a back-thinned type solid-state imaging device wherein the entire region is thinned, the irregular asperity 10 may be formed throughout the entire area of the second principal surface 21b of the p-type semiconductor substrate 21. When the solid-state imaging device SI1 is a back-thinned type solid-state imaging device wherein only the region near the photosensitive region 29 is thinned, the irregular asperity 10 may be formed throughout the entire area of the second principal surface 21b including the peripheral frame portion not thinned in the p-type semiconductor substrate 21, and the inclined faces connected to the frame portion.

A method for manufacturing the solid-state imaging device SI1 of the present embodiment will be described below.

First, the p-type semiconductor substrate 21 is prepared and the n-type semiconductor layer 23 is formed on the first principal surface 21a side of the p-type semiconductor substrate 21. The n-type semiconductor layer 23 is formed by diffusion of an n-type impurity from the first principal surface 21a side in the p-type semiconductor substrate 21.

Next, the accumulation layer 31 is formed on the second principal surface 21b side of the p-type semiconductor substrate 21. The accumulation layer 31 is formed by ion implantation or diffusion of a p-type impurity from the second principal surface 21b side in the p-type semiconductor substrate 21 so that an impurity concentration thereof becomes higher than that of the p-type semiconductor substrate 21, as in the aforementioned embodiment. The accumulation layer 31 has the thickness of, for example, about 0.5 μm. The accumulation layer 31 may be formed before the formation of the irregular asperity 10 or may be formed after the formation of the irregular asperity 10.

Next, the p-type semiconductor substrate 21 is thinned as described above. In the case where the accumulation layer 31 is formed after the formation of the irregular asperity 10, the p-type semiconductor substrate 21 is thinned after the formation of the irregular asperity 10 and thereafter, the accumulation layer 31 is formed.

Next, the p-type semiconductor substrate 21 is subjected to a thermal treatment to activate the accumulation layer 31. The thermal treatment is carried out, for example, in the temperature range of about 800 to 1000° C. under an ambiance of $N_2$ gas for about 0.5 to 1.0 hour. At this time, the crystallinity of the p-type semiconductor substrate 21 is also restored.

Next, the irregular asperity 10 is formed on the second principal surface 21b side of the p-type semiconductor substrate 21. The irregular asperity 10 is formed by irradiating the second principal surface 21b of the p-type semiconductor substrate 21 with the pulsed laser beam, as in the aforementioned embodiment.

Next, the p-type semiconductor substrate 21 is subjected to a thermal treatment. The thermal treatment is carried out, for example, in the temperature range of about 800 to 1000° C. under an ambiance of $N_2$ gas for about 0.5 to 1.0 hour. The thermal treatment brings about recovery of crystal defects and recrystallization in the p-type semiconductor substrate 21, which can prevent such a problem as increase in dark current. The thermal treatment after the formation of the accumulation layer 31 may be omitted, while only the thermal treatment after the formation of the irregular asperity 10 is carried out.

Next, the insulating layer 27 and charge transfer electrodes 25 are formed. Since steps of forming the insulating layer 27 and charge transfer electrodes 25 are known, the description thereof is omitted herein. The charge transfer electrodes 25 are comprised, for example, of polysilicon or metal. The insulating layer 27 is comprised, for example, of $SiO_2$. A protecting film may be further formed so as to cover the insulating layer 27 and the charge transfer electrodes 25. The protecting film is comprised, for example, of BPSG (Boron Phosphor Silicate Glass). This completes the solid-state imaging device SI1.

In the solid-state imaging device SI1, when light is incident to the light incident surface (second principal surface 21b), the incident light is scattered by the asperity 10 to travel in various directions in the p-type semiconductor substrate 21 because the irregular asperity 10 is formed in the second principal surface 21b. Since light components arriving at the first principal surface 21a and others travel in various directions because of the diffusion on the asperity 10, the light components arriving at the first principal surface 21a and others are extremely highly likely to be totally reflected on the first principal surface 21a. The light components totally reflected on the first principal surface 21a and others are repeatedly totally reflected on different faces or, reflected, scattered, or diffused on the second principal surface 21b, whereby their travel distance becomes longer. In this manner, the light incident into the solid-state imaging device SI1 is reflected, scattered, or diffused by the asperity 10 to travel through a long distance in the p-type semiconductor substrate 21. While the light incident into the solid-state imaging device SI1 travels through the long distance inside the p-type semiconductor substrate 21, the light is absorbed in the p-type semiconductor substrate 21 and carriers generated by the light turn to charges at respective pixels of the n-type semiconductor layer 23 to be transferred and detected. Therefore, the solid-state imaging device SI1 is improved in the spectral sensitivity characteristic in the near-infrared wavelength band.

The solid-state imaging device SI1 has a risk of reduction in resolution due to occurrence of crosstalk between pixels resulting from reflection, scattering, or diffusion by the asperity 10. However, since the thickness of the p-type semiconductor substrate 21 is set to not more than the pixel pitch P, the occurrence of crosstalk between pixels can be suppressed in the solid-state imaging device SI1.

In the solid-state imaging device SI1, the accumulation layer 31 is formed on the second principal surface 21b side of the p-type semiconductor substrate 21. This induces recombination of unnecessary carriers generated independent of light on the second principal surface 21b side, which can reduce the dark current. The accumulation layer 31 prevents carriers generated by light near the second principal surface 21b, from being trapped in the second principal surface 21b. For this reason, the carriers generated by light efficiently migrate to the pn junction, which can further improve the photodetection sensitivity of the solid-state imaging device SI1.

In the sixth embodiment, after the formation of the accumulation layer 31, the p-type semiconductor substrate 21 is subjected to the thermal treatment. This restores the crystallinity of the p-type semiconductor substrate 21, which can prevent such a problem as increase in dark current.

In the sixth embodiment, after the thermal treatment of the p-type semiconductor substrate 21, the charge transfer electrodes 25 are formed. This process prevents the charge transfer electrodes 25 from melting during the thermal treatment even in the case where the charge transfer electrodes 25 are made of a material with a relatively low melting point. Therefore, the charge transfer electrodes 25 can be appropriately formed without being affected by the thermal treatment.

In the sixth embodiment, the irregular asperity 10 is formed by the irradiation with the picosecond to femtosecond pulsed laser beam. This permits the irregular asperity 10 to be appropriately and readily formed.

Incidentally, in the case of the semiconductor light-detecting element like the solid-state imaging device, it is possible to realize the solid-state imaging device with the spectral sensitivity characteristic in the near-infrared wavelength band, by setting the semiconductor substrate of silicon thick (e.g., about 200 μm). However, in the case of the semiconductor substrate having the increased thickness, it is necessary to apply a large bias voltage of about several ten V to completely deplete the semiconductor substrate, in order to achieve good resolution. The reason for it is to prevent the following phenomenon: if the semiconductor substrate is not completely depleted and a neutral region still remains in part of the semiconductor substrate, carriers generated in the neutral region will diffuse so as to degrade the resolution.

As the semiconductor substrate becomes thicker, the dark current also increases. For this reason, it is also necessary to cool the semiconductor substrate (e.g., at −70 to −100° C.), thereby to suppress the increase in dark current.

In the solid-state imaging device SI1 of the sixth embodiment, however, since the irregular asperity 10 is formed in the second principal surface 21b as described above, the travel distance of the light incident into the solid-state imaging device SI1 becomes longer. For this reason, it is feasible to realize the solid-state imaging device with the sufficient spectral sensitivity characteristic in the near-infrared wavelength band, without need for increasing the thickness of the semiconductor substrate (p-type semiconductor substrate 21), particularly, the portion corresponding to the photosensitive region 29. Therefore, when compared to the solid-state imaging device with the spectral sensitivity characteristic in the near-infrared wavelength band based on the increase in the thickness of the semiconductor substrate, the aforementioned solid-state imaging device SI1 can achieve good resolution with application of an extremely lower bias voltage or without application of any bias voltage. The cooling of the semiconductor substrate also becomes unnecessary, depending upon the intended use.

When the semiconductor substrate, particularly the portion corresponding to the photosensitive region, is thinned, there is a risk of occurrence of an etalon phenomenon. The etalon phenomenon is a phenomenon of interference between detection target light incident from the back surface and light resulting from reflection of the incident detection target light on the front surface, and affects the detection characteristic in the near-infrared wavelength band. In the solid-state imaging device SI1, however, since light beams reflected on the asperity 10 have dispersed phase differences relative to the phase of the incident light because of the formation of the irregular asperity 10 in the second principal surface 21b, these light beams cancel each other, so as to suppress the etalon phenomenon.

In the sixth embodiment, the p-type semiconductor substrate 21 is thinned from the second principal surface 21b side. This allows the semiconductor light-detecting element to be formed with respective light incident surfaces on the first principal surface 21a and second principal surface 21b sides of the p-type semiconductor substrate 21. Namely, the solid-state imaging device SI1 can also be used as a front-illuminated type solid-state imaging device, as well as a back-thinned type solid-state imaging device.

In the case where the irregular asperity 10 is formed by the irradiation with the pulsed laser beam after the formation of the accumulation layer 31, the thickness of the accumulation layer 31 is preferably set larger than the height difference of the irregular asperity 10. In this case, the accumulation layer 31 remains with certainty even after the irregular asperity 10 is formed by the irradiation with the pulsed laser beam. Therefore, it is feasible to ensure the operational effect by the accumulation layer 31.

Seventh Embodiment

Figure 28:
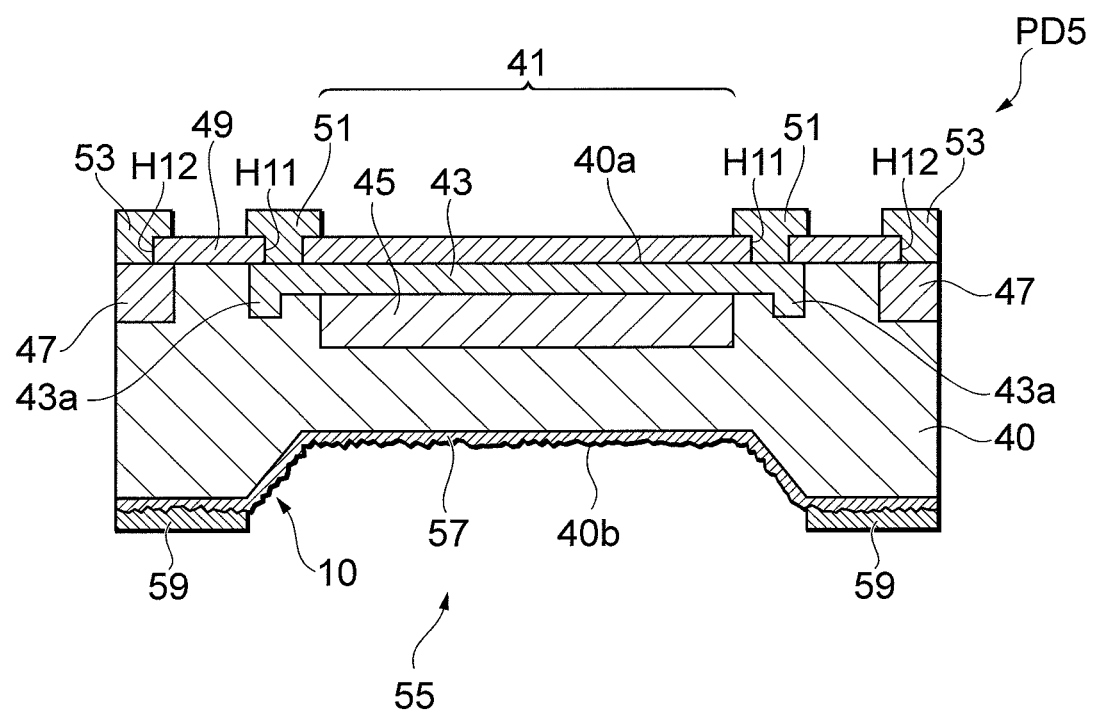
FIG. 28 is a drawing for explaining a configuration of a photodiode according to the seventh embodiment.

A photodiode PD5 according to the seventh embodiment will be described with reference to FIG. 28. FIG. 28 is a drawing for explaining a configuration of the photodiode of the seventh embodiment.

The photodiode PD5 is an avalanche photodiode for detecting low-energy light the wavelength region of which is in the visible to near infrared region. The photodiode PD5 is provided with a p⁻ type semiconductor substrate 40. The p⁻ type semiconductor substrate 40 is comprised of silicon (Si) crystal and has a first principal surface 40a and a second principal surface 40b opposed to each other. The p⁻ type semiconductor substrate 40 includes a photosensitive region 41.

The photosensitive region 41 is disposed in a central region of the first principal surface 40a on a plan view. The photosensitive region 41 has the thickness inward from the first principal surface 40a. The photosensitive region 41 is composed of an n⁺ type impurity region 43, a p⁺ type impurity region 45, and a region that is depleted with application of a bias voltage in the p⁻ type semiconductor substrate 40. The n⁺ type impurity region 43 has the thickness inside the p⁻ type semiconductor substrate 40 from the first principal surface 40a. The n⁺ type impurity region 43 has an n⁺ type guard ring 43a. The n⁺ type guard ring 43a is provided at the peripheral edge of the n⁺ type impurity region 43. The p⁺ type impurity region 45 has the thickness further inside the p⁻ type semiconductor substrate 40 from the n⁺ type impurity region 43. The p⁻ type semiconductor substrate 40 has a p⁺ type diffusion blocking region 47. The p⁺ type diffusion blocking region 47 is disposed at the peripheral edge of the first principal surface 40a on the plan view and has the thickness inward from the first principal surface 40a. The p⁺ type diffusion blocking region 47 is provided so as to surround the photosensitive region 41.

The p⁻ type semiconductor substrate 40 is a silicon substrate doped with a p-type impurity, e.g., such as boron (B). The p⁺ type impurity region 45 is a region doped with a p-type impurity in a higher concentration than the p⁻ type semiconductor substrate 40. The p⁺ type diffusion blocking region 47 is a region doped with a p-type impurity in a higher concentration than the p⁺ type impurity region 45. The n⁺ type impurity region 43 is a region doped with an n-type impurity, e.g., such as antimony (Sb). The n⁺ type impurity region 43 (including the n⁺ type guard ring 43a) and the p⁺ type impurity region 45 constitute a pn junction in the p⁻ type semiconductor substrate 40.

The photodiode PD5 has a passivation film 49 deposited on the first principal surface 40a. The photodiode PD5 has an electrode 51 and an electrode 53 disposed on the passivation film 49. In the passivation film 49, a contact hole H11 is provided on the n⁺ type impurity region 43 and a contact hole H12 is provided on the p⁺ type diffusion blocking region 47. The electrode 51 is in electrical contact with and connection to the n⁺ type impurity region 43 through the contact hole H11. The electrode 53 is in electrical contact with and connection to the p⁺ type diffusion blocking region 47 through the contact hole H12. A material of the passivation film 49 is, for example, silicon oxide or the like.

The photodiode PD5 has a recess 55 formed on the second principal surface 40b side. The recess 55 is formed by thinning the p⁻ type semiconductor substrate 40 from the second principal surface 40b side and a thick frame portion exists around the recess 55. The side face of the recess 55 is inclined at an obtuse angle relative to the bottom face of the recess 55. The recess 55 is formed so as to overlap the photosensitive region 41 on the plan view. The thickness between the bottom face of the recess 55 and the first principal surface 40a is relatively small, e.g., about 100-200 μm, and is preferably about 150 μm. Since the thickness between the first principal surface 40a and the bottom face of the recess 55 is relatively small as described above, the response speed becomes higher and the bias voltage applied to the photodiode PD5 is reduced.

The irregular asperity 10 is formed throughout the entire second principal surface 40b of the p⁻ type semiconductor substrate 40. An accumulation layer 57 is formed on the second principal surface 40b side of the p⁻ type semiconductor substrate 40. In the accumulation layer 57, a region corresponding to the bottom face of the recess 55, i.e., the region opposed to the photosensitive region 41 forming the avalanche photodiode is optically exposed. That the second principal surface 40b is optically exposed embraces, not only the case where the second principal surface 40b is in contact with ambient gas such as air, but also the case where an optically transparent film is formed on the second principal surface 40b. The irregular asperity 10 may be formed only in the bottom face of the recess 55, i.e., only in the region opposed to the photosensitive region 51 functioning as the avalanche photodiode.

The photodiode PD5 has an electrode 59. The electrode 59 is provided on the accumulation layer 57 and is in electrical contact with and connection to the accumulation layer 57. The region where the electrode 59 is formed in the accumulation layer 57 is not optically exposed.

In the photodiode PD5 having the above configuration, when a reverse bias voltage (breakdown voltage) is applied to the electrode 51 and the electrode 59, carriers according to the quantity of light incident into the photosensitive region 41 are generated in the photosensitive region 41. The carriers generated near the p+ type diffusion blocking region 47 flow into the p+ type diffusion blocking region 47. For this reason, the p+ type diffusion blocking region 47 reduces a tail in an output signal from the electrode 51.

The following will describe a method for manufacturing the photodiode PD5 of the seventh embodiment.

First, the p− type semiconductor substrate 40 is prepared. The thickness of the p− type semiconductor substrate 40 is about 300 μm.

Next, the p+ type impurity region 45 and p+ type diffusion blocking region 47 are formed on the first principal surface 40a side of the p− type semiconductor substrate 40. The p+ type impurity region 45 is formed by ion implantation of a p-type impurity in a high concentration from the first principal surface 40a side in the p− type semiconductor substrate 40, using a mask opening in a central region. The p+ type diffusion blocking region 47 is formed by diffusing a p-type impurity in a high concentration from the first principal surface 40a side in the p− type semiconductor substrate 40, using another mask opening in a peripheral region.

Next, the n+ type guard ring 43a and the n+ type impurity region 43 are formed on the first principal surface 40a side of the p− type semiconductor substrate 40. The n+ type guard ring 43a is formed by diffusing an n-type impurity in a high concentration from the first principal surface 40a side in the p− type semiconductor substrate 40, using a mask opening in a ring shape. The n+ type impurity region 43 is formed by ion implantation of an n-type impurity in a high concentration from the first principal surface 40a side in the p− type semiconductor substrate 40, using another mask opening in a central region.

Next, the surface of the second principal surface 40b of the p− type semiconductor substrate 40 is planarized by polishing. Thereafter, a portion corresponding to the p+ type impurity region 45 in the p− type semiconductor substrate 40 is thinned from the second principal surface 40b side while leaving a surrounding region around the thinned portion. The thinning of the p− type semiconductor substrate 40 is carried out by anisotropic etching, e.g., alkali etching using a KOH aqueous solution, TMAH, or the like. The thickness of the thinned portion of the p− type semiconductor substrate 40 is, for example, about 150 μm and the thickness of the surrounding region is, for example, about 200 μm.

Next, the accumulation layer 57 is formed on the second principal surface 40b side of the p− type semiconductor substrate 40. Here, the accumulation layer 57 is formed by ion implantation of a p-type impurity in a higher impurity concentration than in the p− type semiconductor substrate 40, from the second principal surface 40b side in the p− type semiconductor substrate 40. The thickness of the accumulation layer 57 is, for example, about 1.5 μm.

Next, the p− type semiconductor substrate 40 is subjected to a thermal treatment (annealing) to activate the accumulation layer 57. Here, the p− type semiconductor substrate 40 is heated in the temperature range of about 800 to 1000° C. in an ambiance such as $N_2$ gas for about 0.5 to 1.0 hour.

Next, the second principal surface 40b of the p− type semiconductor substrate 40 is irradiated with a pulsed laser beam PL to form the irregular asperity 10. The irregular asperity 10 is formed by irradiating the second principal surface 40b of the p− type semiconductor substrate 40 with the pulsed laser beam, as in the aforementioned embodiments.

Next, the p− type semiconductor substrate 40 is subjected to a thermal treatment (annealing). Here, the p− type semiconductor substrate 40 is heated in the temperature range of about 800 to 1000° C. in an ambiance such as $N_2$ gas for about 0.5-1.0 hour. The thermal treatment achieves recovery of crystal defects and recrystallization in the p-type semiconductor substrate 40, so as to prevent the problem such as the increase of dark current.

Next, the passivation film 49 is formed on the first principal surface 40a side of the p− type semiconductor substrate 40. Then the contact holes H11, H12 are formed in the passivation film 49 and the electrodes 51, 53 are formed. The electrode 51 is formed in the contact hole H11 and the electrode 53 in the contact hole H12. Furthermore, the electrode 59 is formed on the accumulation layer 57 in the surrounding region around the thinned portion of the p− type semiconductor substrate 40. The electrodes 51, 53 each are comprised of aluminum (Al) or the like and the electrode 59 is comprised of gold (Au) or the like. This completes the photodiode PD5.

In the photodiode PD5, since the irregular asperity 10 is formed in the second principal surface 40b, the light incident into the photodiode PD5 is reflected, scattered, or diffused by the asperity 10 to travel through a long distance in the p− type semiconductor substrate 40.

In the photodiode PD5, where the light is incident from the direction normal to a light incident surface (first principal surface 40a), when the light arrives at the irregular asperity 10 formed in the second principal surface 40b, light components arriving thereat at angles of not less than 16.6° relative to the direction of emergence from the asperity 10 are totally reflected by the asperity 10. Since the asperity 10 is formed irregularly, it has various angles relative to the emergence direction and diffuses the totally reflected light components into various directions. For this reason, the totally reflected light components include light components absorbed inside the p− type semiconductor substrate 40 and light components reaching the first principal surface 40a and side faces.

Since the light components reaching the first principal surface 40a and the side faces travel in various directions because of the diffusion on the asperity 10, the light components reaching the first principal surface 40a and the side faces are extremely highly likely to be totally reflected by the first principal surface 40a and the side faces. The light components totally reflected by the first principal surface 40a and the side faces are repeatedly totally reflected on different faces, whereby the travel distance thereof further increases. The light incident into the photodiode PD5 is absorbed by the p− type semiconductor substrate 40 during the travel through the long distance inside the p− type semiconductor substrate 40 to be detected as a photocurrent.

In this manner, the light L incident into the photodiode PD5 mostly travels, without being transmitted by the photodiode PD5, through the long travel distance to be absorbed in the p− type semiconductor substrate 40. Therefore, the photodiode PD5 is improved in the spectral sensitivity characteristic in the near-infrared wavelength band.

In the photodiode PD5, the accumulation layer 57 is formed on the second principal surface 40b side of the p− type semiconductor substrate 40. This induces recombination of unnecessary carriers generated on the second principal surface 40b side, so as to reduce the dark current. The accumulation layer 57 prevents carriers generated near the second principal surface 40b, from being trapped in the second principal surface 40b. For this reason, the generated carriers efficiently migrate to the pn junction, so as to further improve the photodetection sensitivity of the photodiode PD5.

In the seventh embodiment, the p⁻ type semiconductor substrate 40 is subjected to the thermal treatment, after formation of the accumulation layer 57. This restores the crystallinity of the p⁻ type semiconductor substrate 40, so as to prevent the problem such as the increase of dark current.

The accumulation layer 57 may be formed after formation of the irregular asperity 10. In the case where the irregular asperity 10 is formed by irradiation with the pulsed laser light, after the formation of the accumulation layer 57, the thickness of the accumulation layer 57 is preferably set to be larger than the height difference of the irregular asperity 10. In this case, the accumulation layer 57 is certainly left even after the irregular asperity 10 is formed by irradiation with the pulsed laser light. The operational effect by the accumulation layer 57 can be ensured accordingly.

In the seventh embodiment, the electrodes 51, 53, 59 are formed after the thermal treatment of the p⁻ type semiconductor substrate 40. This prevents the electrodes 51, 53, 59 from melting during the thermal treatment, even if the electrodes 51, 53, 59 are made of materials with a relatively low melting point. Therefore, the electrodes 51, 53, 59 can be appropriately formed without being affected by the thermal treatment.

In the seventh embodiment, the irregular asperity 10 is formed by irradiation with the picosecond to femtosecond pulsed laser beam. This allows the irregular asperity 10 to be appropriately and readily formed.

In the seventh embodiment, the p⁻ type semiconductor substrate 40 is thinned from the second principal surface 40b side. This allows us to obtain the photodiode with the respective light incident surfaces on the first principal surface 40a side and the second principal surface 40b side of the p⁻ type semiconductor substrate 40. Namely, the photodiode PD5 can be used, not only as a front-illuminated type photodiode, but also as a back-thinned type photodiode.

Incidentally, concerning the avalanche photodiode, it is possible to realize the semiconductor light-detecting element with a practically sufficient spectral sensitivity characteristic in the near-infrared wavelength band, by setting the semiconductor substrate of silicon thick (e.g., about several hundred μm to 2 mm). However, the avalanche photodiode necessitates the bias voltage for depletion and the bias voltage for avalanche multiplication and, therefore, in the case where the thickness of the semiconductor substrate is set large, it becomes necessary to apply the extremely high bias voltage. The thick semiconductor substrate also increases the dark current.

In the photodiode PD5 of the seventh embodiment, however, since the irregular asperity 10 is formed in the second principal surface 40b as described above, the travel distance of the light incident into the photodiode PD5 is lengthened. For this reason, it is feasible to realize the photodiode with the practically sufficient spectral sensitivity characteristic in the near-infrared wavelength band, without need for increasing the thickness of the semiconductor substrate (p⁻ type semiconductor substrate 40), particularly, the portion corresponding to the photosensitive region 41. Therefore, the foregoing photodiode PD5 can achieve the good spectral sensitivity characteristic with application of a lower bias voltage than the photodiode with the spectral sensitivity characteristic in the near-infrared wavelength band based on the increase in the thickness of the semiconductor substrate. In addition, the increase of dark current is suppressed, so as to improve the detection accuracy of the photodiode PD5. Furthermore, since the thickness of the p⁻ type semiconductor substrate 40 is small, the response speed of the photodiode PD5 improves.

In the photodiode PD5 of the seventh embodiment, the entire region on the second principal surface 40b side may be thinned.

Eighth Embodiment

Figure 29:
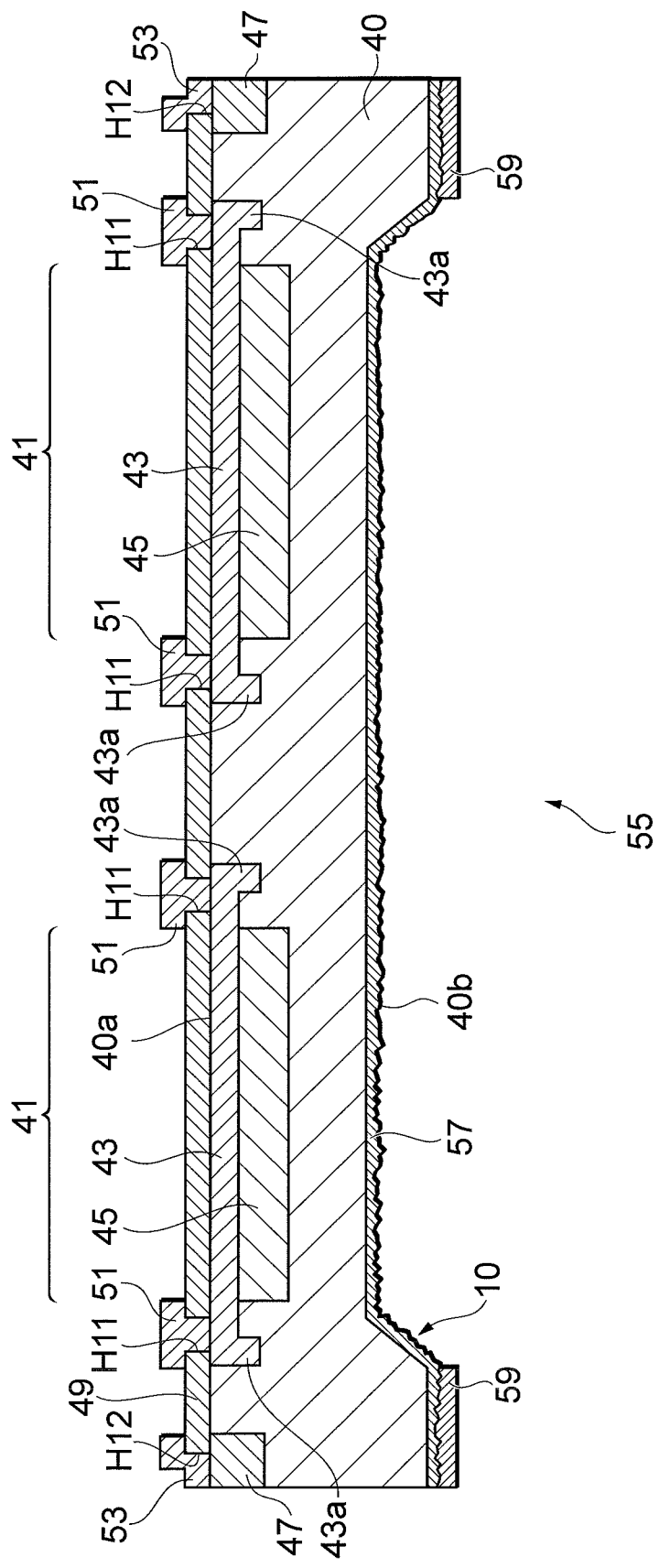
FIG. 29 is a drawing for explaining a configuration of a photodiode array according to the eighth embodiment.

A photodiode array PDA2 according to the eighth embodiment will be described with reference to FIG. 29. FIG. 29 is a drawing for explaining a configuration of the photodiode array according to the eighth embodiment.

The photodiode array PDA2 is provided with a p⁻ type semiconductor substrate 40, and a plurality of photosensitive regions 41 functioning as avalanche photodiodes are arranged on the p⁻ type semiconductor substrate 40.

The irregular asperity 10 is formed throughout the entire second principal surface 40b of the p⁻ type semiconductor substrate 40. Namely, the photodiode array PDA2 has the irregular asperity 10 formed not only in regions opposed to the photosensitive regions 41 functioning as avalanche photodiodes, but also in regions opposed to the regions between the photosensitive regions 41.

In the eighth embodiment, as in the seventh embodiment, the travel distance of light incident into the photodiode array PDA2 also becomes long and the distance of absorption of light also becomes long. This allows the photodiode array PDA2 also to be improved in the spectral sensitivity characteristic in the near-infrared wavelength band.

The photodiode array PDA2 of the eighth embodiment, as in the seventh embodiment, can achieve the good spectral sensitivity characteristic with application of a lower bias voltage than a photodiode array with a spectral sensitivity characteristic in the near-infrared wavelength band based on the increase in the thickness of the semiconductor substrate. In addition, the increase of dark current is suppressed, so as to improve the detection accuracy of the photodiode array PDA2. Furthermore, since the thickness of the p⁻ type semiconductor substrate 40 is small, the response speed of the photodiode array PDA2 improves.

In the photodiode array PDA2, the irregular asperity 10 is also formed in the regions opposed to the regions between the photosensitive regions 41 in the second principal surface 40b of the p⁻ type semiconductor substrate 40. For this reason, light L incident between the photosensitive regions 41 is reflected, scattered, or diffused by the irregular asperity 10 formed in the regions opposed to the regions between the photosensitive regions 41 in the second principal surface 40b to be absorbed by any one of the photosensitive regions 41. In the photodiode array PDA, therefore, the detection sensitivity is not lowered between the photosensitive regions 41, so as to improve the photodetection sensitivity.

The photodiode array PDA2 can also be used as a device for detecting YAG laser light as the photodiode PD5 of the seventh embodiment.

In the photodiode array PDA2 the entire region on the second principal surface 40b side may be thinned. The photodiode array PDA2 can be used as a photodiode array of either of the front-illuminated type and the back-thinned type.

Ninth Embodiment

Figure 30:
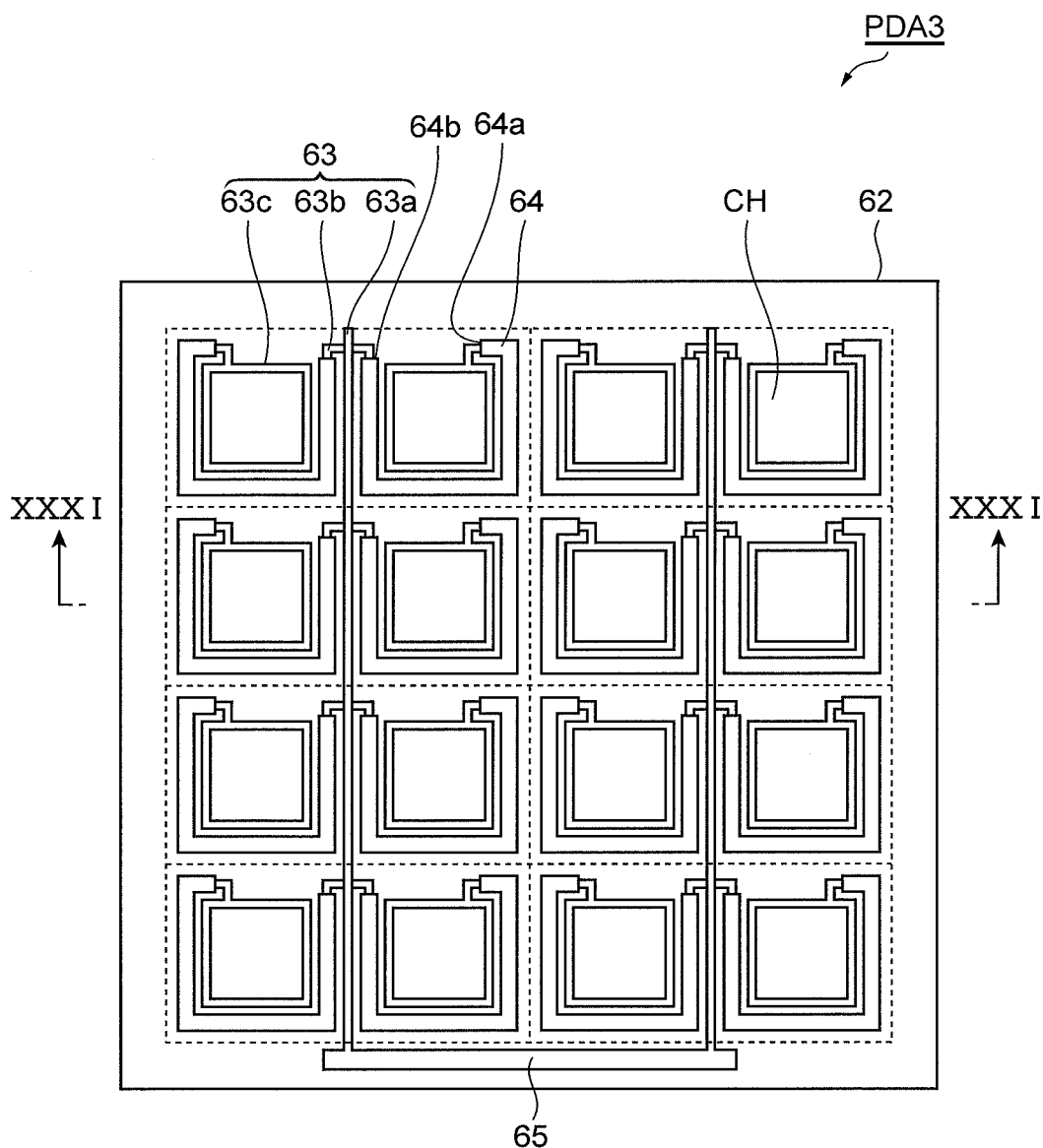
FIG. 30 is a plan view schematically showing a photodiode array according to the ninth embodiment.

A configuration of a photodiode array PDA3 according to the ninth embodiment will be described with reference to FIGS. 30 and 31. FIG. 30 is a plan view schematically showing the photodiode array PDA3 of the ninth embodiment.

Figure 31:
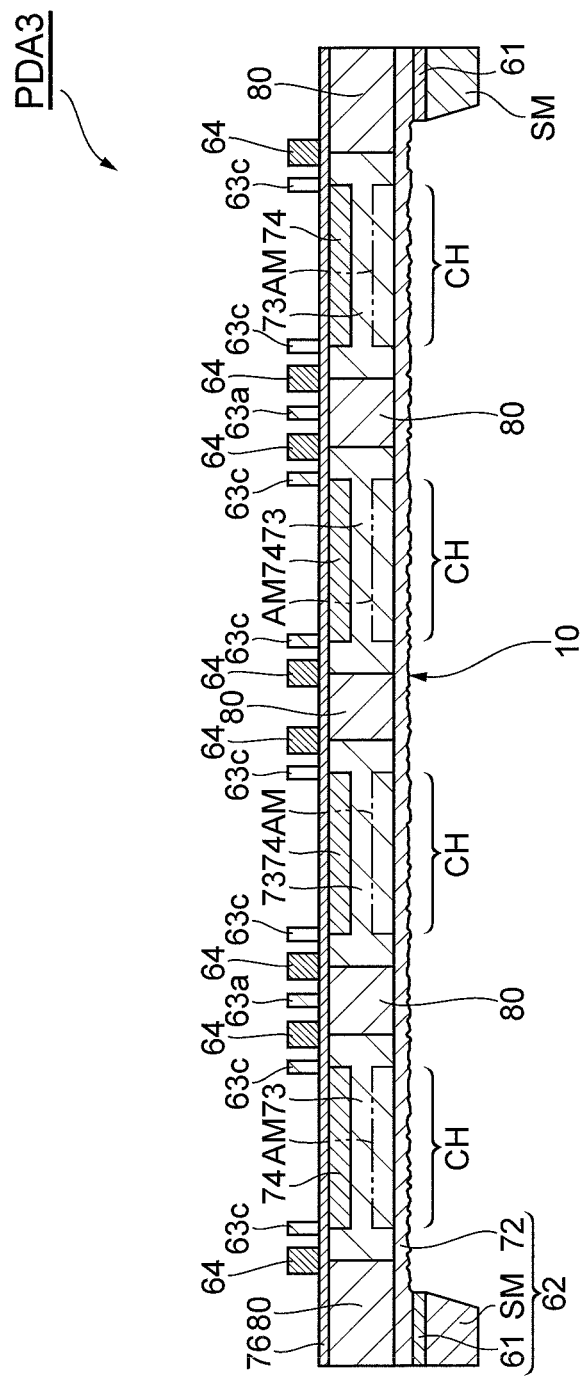
FIG. 31 is a drawing showing a cross-sectional configuration along the line XXXI-XXXI in FIG. 30.

FIG. 31 is a drawing showing a cross-sectional configuration along the line XXXI-XXXI of the photodiode array PDA3 shown in FIG. 30.

The photodiode array PDA3 is composed of a plurality of semiconductor layers and an insulating layer layered on a substrate 62. As shown in FIG. 30, the photodiode array PDA3 is a multichannel avalanche photodiode for photon counting in which a plurality of photodetecting channels CH for detection target light to be injected thereinto are formed in a matrix pattern (4×4 in the present embodiment). There are signal conductor wires 63, resistors 64, and an electrode pad 65 provided on the top side of the photodiode array PDA3. The substrate 62 has, for example, a square shape about 1 mm on each side. Each photodetecting channel CH has, for example, a square shape.

The signal conductor wire 63 consists of a readout portion 63a, connecting portions 63b, and channel peripheral portions 63c. The readout portion 63a transfers a signal output from each photodetecting channel CH. The connecting portion 63b connects each resistor 64 and the readout portion 63a. Each channel peripheral portion 63c is routed so as to surround the periphery of the photodetecting channel CH. The readout portion 63a is connected to each of the photodetecting channels CH arranged in two adjacent columns with the readout portion 63a in between, and is connected at one end thereof to the electrode pad 65. Since in the present embodiment the photodiodes are arranged in the 4×4 matrix pattern, there are two readout portions 63a as wiring on the photodiode array PDA3 and these are connected both to the electrode pad 65. The signal conductor wires 63 are comprised, for example, of aluminum (Al).

The resistor 64 is provided for each photodetecting channel CH through one end portion 64a and the channel peripheral portion 63c and is connected through the other end portion 64b and the connecting portion 63b to the readout portion 63a. A plurality of resistors 64 (eight in the present embodiment) to be connected to an identical readout portion 63a are connected to the readout portion 63a. The resistors 64 are comprised, for example, of polysilicon (Poly-Si).

Next, the cross-sectional configuration of the photodiode array PDA3 will be described with reference to FIG. 31. As shown in FIG. 31, the photodiode array PDA3 is provided with a substrate 62 having a semiconductor layer with the conductivity type of n-type (first conductivity type), a p⁻ type semiconductor layer 73 with the conductivity type of p-type (second conductivity type) formed on the substrate 62, p⁺ type semiconductor regions 74 with the conductivity type of p-type formed on the p⁻ type semiconductor layer 73, a protecting film 76, a separating portion 80 with the conductivity type of n-type (first conductivity type) formed in the p⁻ type semiconductor layer 73, and the aforementioned signal conductor wires 63 and resistors 64 formed on the protecting film 76. The detection target light is injected from the top side or the bottom side in FIG. 31.

The substrate 62 has a substrate member SM, an insulating film 61 formed on the substrate member SM, and an n⁺ type semiconductor layer 72 formed on the insulating film 61. The substrate member SM is comprised of Si (silicon). The insulating film 61 is comprised, for example, of $SiO_2$ (silicon oxide). The n⁺ type semiconductor layer 72 is a semiconductor layer with the conductivity type of n-type comprised of Si and having a high impurity concentration. The thickness of the n⁺ type semiconductor layer 72 is, for example, 1 µm-12 µm.

The p⁻ type semiconductor layer 73 is an epitaxial semiconductor layer with the conductivity type of p-type having a low impurity concentration. The p⁻ type semiconductor layer 73 forms pn junctions at the interface to the substrate 62. The p⁻ type semiconductor layer 73 has a plurality of multiplication regions AM for avalanche multiplication of carriers generated with incidence of the detection target light, corresponding to the respective photodetecting channels CH. The thickness of the p⁻ type semiconductor layer 73 is, for example, 3 µm-5 µm. The p⁻ type semiconductor layer 73 is comprised of Si. Therefore, the n⁺ type semiconductor layer 72 and the p⁻ type semiconductor layer 73 constitute a silicon substrate.

The p⁺ type semiconductor regions 74 are formed on the p⁻ type semiconductor layer 73, corresponding to the multiplication regions AM of the respective photodetecting channels CH. Namely, each multiplication region AM is a region near the interface to the substrate 62 in the p⁻ type semiconductor layer 73 located below the p⁺ type semiconductor region 74 in the lamination direction of semiconductor layers (which will be referred to hereinafter simply as the lamination direction). The p⁺ type semiconductor regions 74 are comprised of Si.

The separating portion 80 is formed between the plurality of photodetecting channels CH to separate the photodetecting channels CH. Namely, the separating portion 80 is formed so as to form the multiplication regions AM in the p⁻ type semiconductor layer 73 in one-to-one correspondence to the respective photodetecting channels CH. The separating portion 80 is formed in a two-dimensional lattice pattern on the substrate 62 so as to completely surround the periphery of each multiplication region AM. The separating portion 80 is formed so as to penetrate from the top side to the bottom side of the p⁻ type semiconductor layer 73 in the lamination direction. The separating portion 80 is a semiconductor layer with the conductivity type of n-type an impurity of which is comprised, for example, of P and an impurity concentration of which is high. If the separating portion 80 is formed by diffusion, a long thermal treatment time will be needed, and it is, therefore, considered that the impurity of the n⁺ type semiconductor layer 72 diffuses into the epitaxial semiconductor layer so as to cause a rise of interfaces of the pn junctions. In order to prevent this rise, the separating portion 80 may be formed in such a manner that a trench is formed by etching near centers of regions corresponding to the separating portion 80 and thereafter the diffusion of the impurity is performed. A light blocking portion may be formed in the trench groove by filling the trench groove with a material to absorb or reflect the light in the wavelength band to be absorbed by the photodetecting channels. In this case, it is feasible to prevent crosstalk caused by influence of emission by avalanche multiplication on neighboring photodetecting channels.

The p⁻ type semiconductor layer 73, p⁺ type semiconductor regions 74, and separating portion 80 form a flat surface on the top side of the photodiode array PDA3 and the protecting film 76 is formed thereon. The protecting film 76 is made of an insulating layer comprised, for example, of $SiO_2$.

The signal conductor wires 63 and resistors 64 are formed on the protecting film 76. The readout portions 63a of the signal conductor wires 63 and the resistors 64 are formed above the separating portion 80.

The signal conductor wires 63 function as anodes and the photodiode array may be provided with a transparent electrode layer (e.g., a layer comprised of ITO (Indium Tin Oxide)) over the entire surface on the bottom side (the side without the insulating film 61) of the substrate 62, as a cathode though not shown. Alternatively, as a cathode, an electrode portion may be formed so as to be drawn out to the front side.

Figure 32:
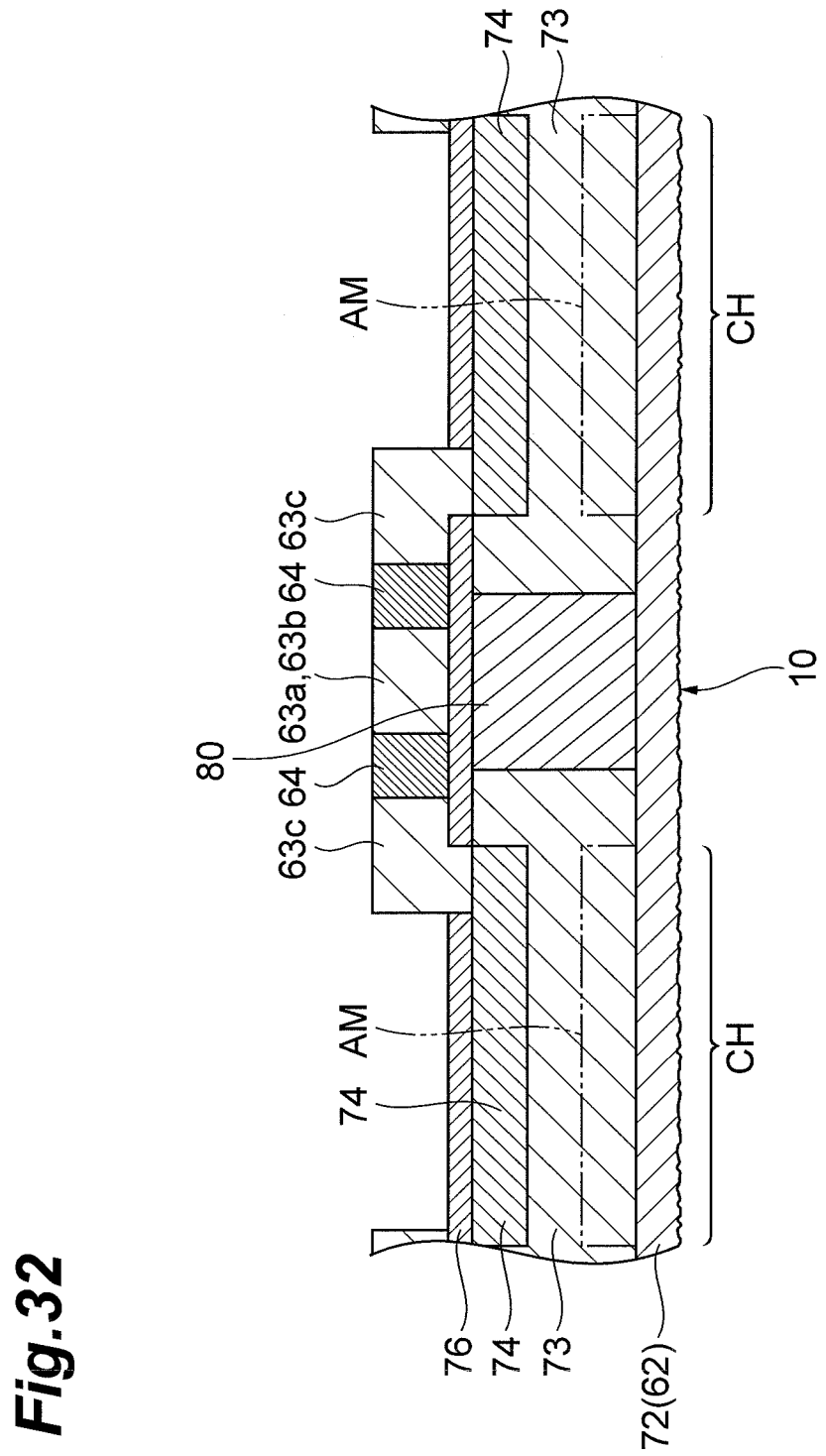
FIG. 32 is a drawing schematically explaining a connection relation of each photodetecting channel with a signal conductor wire and a resistor.

Now, a connection relation of each photodetecting channel CH to the signal conductor wire 63 and resistor 64 will be described with reference to FIG. 32. FIG. 32 is a drawing for schematically explaining the connection relation of each photodetecting channel CH to the signal conductor wire 63 and resistor 64. As shown in FIG. 32, the $p^+$ type semiconductor region 74 of each photodetecting channel CH is directly connected to the signal conductor wire 63 (channel peripheral portion 63c). This establishes electrical connection between the signal conductor wire 63 (channel peripheral portion 63c) and the $p^-$ type semiconductor layer 73. The $p^-$ type semiconductor layer 73 and one end 64a of the resistor 64 are connected through the signal conductor wire 63 (channel peripheral portion 63c) and the other end 64b of each resistor 64 is connected through the connecting portion 63b to the readout portion 63a.

In the substrate 62, the region where the plurality of photodetecting channels CH are formed is thinned from the substrate member SM side, so as to remove a portion corresponding to the region where the plurality of photodetecting channels CH are formed in the substrate member SM. The substrate member SM exists as a frame portion around the thinned region. By removing the frame portion as well, the substrate 62 may have a configuration wherein the entire region is thinned, i.e., the whole substrate member SM is removed. The removal of the substrate member SM can be implemented by etching (e.g., dry etching or the like), polishing, and so on. In the case where the substrate member SM is removed by dry etching, the insulating film 61 also functions as an etching stop layer. The insulating film 61 exposed after the removal of the substrate member S is removed as described later.

In the surface of the $n^+$ type semiconductor layer 72, the irregular asperity 10 is formed throughout the entire region where the plurality of photodetecting channels CH are formed. The region where the irregular asperity 10 is formed in the surface of the $n^+$ type semiconductor layer 72 is optically exposed. That the surface of the $n^+$ type semiconductor layer 72 is optically exposed embraces, not only the case where the surface of the $n^+$ type semiconductor layer 72 is in contact with ambient gas such as air, but also the case where an optically transparent film is formed on the surface of the $n^+$ type semiconductor layer 72. The irregular asperity 10 may also be formed only in the regions opposed to the respective photodetecting channels CH.

The irregular asperity 10 is formed by irradiating the insulating film 61 exposed after the removal of the substrate member SM, with a pulsed laser beam, in the same manner as in the aforementioned embodiments. Namely, when the exposed insulating film 61 is irradiated with the pulsed laser beam, the insulating film 61 is removed and the surface of the $n^+$ type semiconductor layer 72 is roughened by the pulsed laser beam, thereby forming the irregular asperity 10.

After the formation of the irregular asperity 10 by irradiation with the pulsed laser beam, the substrate 62 is preferably subjected to a thermal treatment (annealing). For example, the substrate 62 is heated in the temperature range of about 800 to 1000° C. in an ambiance of $N_2$ gas or the like for about 0.5 to 1.0 hour. The foregoing thermal treatment achieves recovery of crystal defects and recrystallization in the $n^+$ type semiconductor layer 72 so as to prevent the problem such as the increase of dark current.

When the photodiode array PDA3 configured as described above is used for photon counting, it is operated under an operation condition called a Geiger mode. In the Geiger mode operation, a reverse voltage (e.g., 50 V or more) higher than the breakdown voltage is applied to each photodetecting channel CH. When the detection target light is incident from the top side into each photodetecting channel CH in this state, the target light is absorbed in each photodetecting channel CH to generate a carrier. The generated carrier migrates as accelerated according to an electric field in each photodetecting channel CH to be multiplied in each multiplication region AM. Then the multiplied carriers are taken out through the resistor 64 and through the signal conductor wire 63 to the outside to be detected based on a wave height value of an output signal thereof. Since every channel detecting a photon provides the same quantity of output, the total output from all the channels is detected, thereby counting how many photodetecting channels CH in the photodiode array PDA3 provided the output. Therefore, the photodiode array PDA3 accomplishes the photon counting by the single irradiation operation with the detection target light.

Incidentally, since the irregular asperity 10 is formed in the surface of the $n^+$ type semiconductor layer 72 in the photodiode array PDA3, the light incident into the photodiode array PDA3 is reflected, scattered, or diffused by the asperity 10 to travel through a long distance in the photodiode array PDA3.

For example, in the case where the photodiode array PDA3 is used as a front-illuminated type photodiode array and where the light is incident from the protecting film 76 side into the photodiode array PDA3, when the light reaches the irregular asperity 10 formed in the surface of the $n^+$ type semiconductor layer 72, light components arriving thereat at angles of not less than 16.6° to the direction of emergence from the asperity 10 are totally reflected by the asperity 10. Since the asperity 10 is formed irregularly, it has various angles relative to the emergence direction and the totally reflected light components diffuse into various directions. For this reason, the totally reflected light components include light components absorbed in each photodetecting channel CH and light components reaching the surface on the protecting film 76 side and the side faces of the $n^+$ type semiconductor layer 72.

The light components reaching the surface on the protecting film 76 side and the side faces of the $n^+$ type semiconductor layer 72 travel in various directions because of the diffusion on the asperity 10. For this reason, the light components reaching the surface on the protecting film 76 side and the side faces of the $n^+$ type semiconductor layer 72 are extremely highly likely to be totally reflected on the surface on the protecting film 76 side and the side faces of the $n^+$ type semiconductor layer 72. The light components totally reflected on the surface on the protecting film 76 side and the side faces of the $n^+$ type semiconductor layer 72 are repeatedly totally reflected on different faces, to further increase their travel distance. While the light incident into the photodiode array PDA3 travels through the long distance inside the photodiode array PDA3, it is absorbed in each photodetecting channel CH to be detected as a photocurrent.

In the case where the photodiode array PDA3 is used as a back-thinned type photodiode array and where the light is incident from the front surface side of the $n^+$ type semiconductor layer 72 into the photodiode array PDA3, the incident light is scattered by the asperity 10 and travels in various directions in the photodiode array PDA3. Since the light components reaching the surface on the protecting film 76 side and the side faces of the $n^+$ type semiconductor layer 72 travel in various directions because of the diffusion on the asperity 10, the light components reaching the surface on the protecting film 76 side and the side faces of the $n^+$ type semiconductor layer 72 are extremely highly likely to be totally reflected on each surface. The light components totally reflected on the surface on the protecting film 76 side and the side faces of the n⁺ type semiconductor layer 72 are repeatedly totally reflected on different faces, or reflected, scattered, or diffused on the asperity 10, to further increase their travel distance. The light incident into the photodiode array PDA3 is reflected, scattered, or diffused by the asperity 10 to travel through the long distance in the photodiode array PDA3 and to be absorbed in each photodetecting channel CH to be detected as a photocurrent.

The light L incident into the photodiode array PDA3 mostly travels through the long travel distance to be absorbed in each photodetecting channel CH, without passing through the photodiode array PDA3. Therefore, the photodiode array PDA3 is improved in the spectral sensitivity characteristic in the near-infrared wavelength band.

In the ninth embodiment, the irregular asperity 10 is formed in the surface of the n⁺ type semiconductor layer 72. For this reason, it induces recombination of unnecessary carriers generated independent of light on the surface side where the irregular asperity 10 is formed, so as to reduce the dark current. The n⁺ type semiconductor layer 72 functions as an accumulation layer to prevent carriers generated by light near the surface of the n⁺ type semiconductor layer 72, from being trapped in the surface. For this reason, the carriers generated by light efficiently migrate to the multiplication regions AM, so as to improve the photodetection sensitivity of the photodiode array PDA3.

In the ninth embodiment, the irregular asperity 10 is also formed in the surface corresponding to the regions between the plurality of photodetecting channels CH in the n⁺ type semiconductor layer 72 and the surface is optically exposed. For this reason, light incident into the regions between the plurality of photodetecting channels CH is also reflected, scattered, or diffused by the irregular asperity 10 to be absorbed in any one of the photodetecting channels CH. Therefore, the detection sensitivity is not lowered in the regions between the photodetecting channels CH, whereby the photodetection sensitivity of the photodiode array PDA3 is further improved.

In the ninth embodiment, the thickness of the n⁺ type semiconductor layer 72 is larger than the height difference of the irregular asperity 10. For this reason, it is feasible to certainly ensure the operational effect as an accumulation layer by the n⁺ type semiconductor layer 72.

In the photodiode array PDA3, the pn junctions are composed of the n⁺ type semiconductor layer 72 of the substrate 62 and the p⁻ type semiconductor layer 73 being the epitaxial semiconductor layer formed on the n⁺ type semiconductor layer 72 of the substrate 62. The multiplication regions AM are formed in the p⁻ type semiconductor layer 73 where the pn junctions are substantialized, and the correspondence of each multiplication region AM to each photodetecting channel CH is realized by the separating portion 80 formed between the photodetecting channels CH. A pn junction surface is composed of an interface between the n⁺ type semiconductor layer 72 and the p⁻ type semiconductor layer 73 and an interface between the separating portion 80 and the p⁻ type semiconductor layer 73. For this reason, the high-concentration impurity regions are convex and there is no region having a high electric field. Therefore, the photodiode array PDA3 has no ends (edges) of pn junctions where edge breakdown occurs in the Geiger mode operation. For this reason, the photodiode array PDA3 does not have to be provided with a guard ring for the pn junction of each photodetecting channel CH. This enables the photodiode array PDA3 to have a drastically high aperture rate.

By achieving the high aperture rate, it also becomes feasible to increase the detection efficiency of the photodiode array PDA3.

Since the photodetecting channels CH are separated by the separating portion 80, it becomes feasible to well suppress crosstalk.

Even if in the Geiger mode operation a large voltage difference is made between a photodetecting channel with incidence of a photon and a channel without incidence, the channels can be separated well because the separating portion 80 is formed between the photodetecting channels CH.

Since in the photodiode array PDA3 the readout portions 63a of the signal conductor wires 63 are formed above the separating portion 80, the signal conductor wires 63 are prevented from crossing above the multiplication regions AM, i.e., above the photodetection surface. For this reason, the aperture rate is more increased. Furthermore, it is considered to be also effective to suppression of dark current. In the photodiode array PDA3, the aperture rate is still more increased because the resistors 64 are also formed above the separating portion 80.

The inventor of the present application discovered from wavelength dependence of after pulse that in the case where the n-type semiconductor substrate was used and the p-type epitaxial semiconductor layer was formed thereon, some of holes generated in the n-type semiconductor substrate went late into the multiplication region to produce an after pulse. In view of this problem, the photodiode array PDA3 is constructed by removing the substrate member SM from the region where the plurality of photodetecting channels CH are formed, so as to suppress the after pulse.

In the ninth embodiment, the number of photodetecting channels formed in the photodiode array does not have to be limited to the number (4×4) in the above embodiment. The number of separating portion 80 formed between the light-detecting channels is not limited to the number described in the above embodiment and modification examples, either, but may be three or more. The signal conductor wires 63 do not always have to be formed above the separating portions 80. The resistors 64 do not always have to be formed above the separating portions 80, either. The layers and others are not limited only to those exemplified in the above embodiment.

Tenth Embodiment

Figure 33:
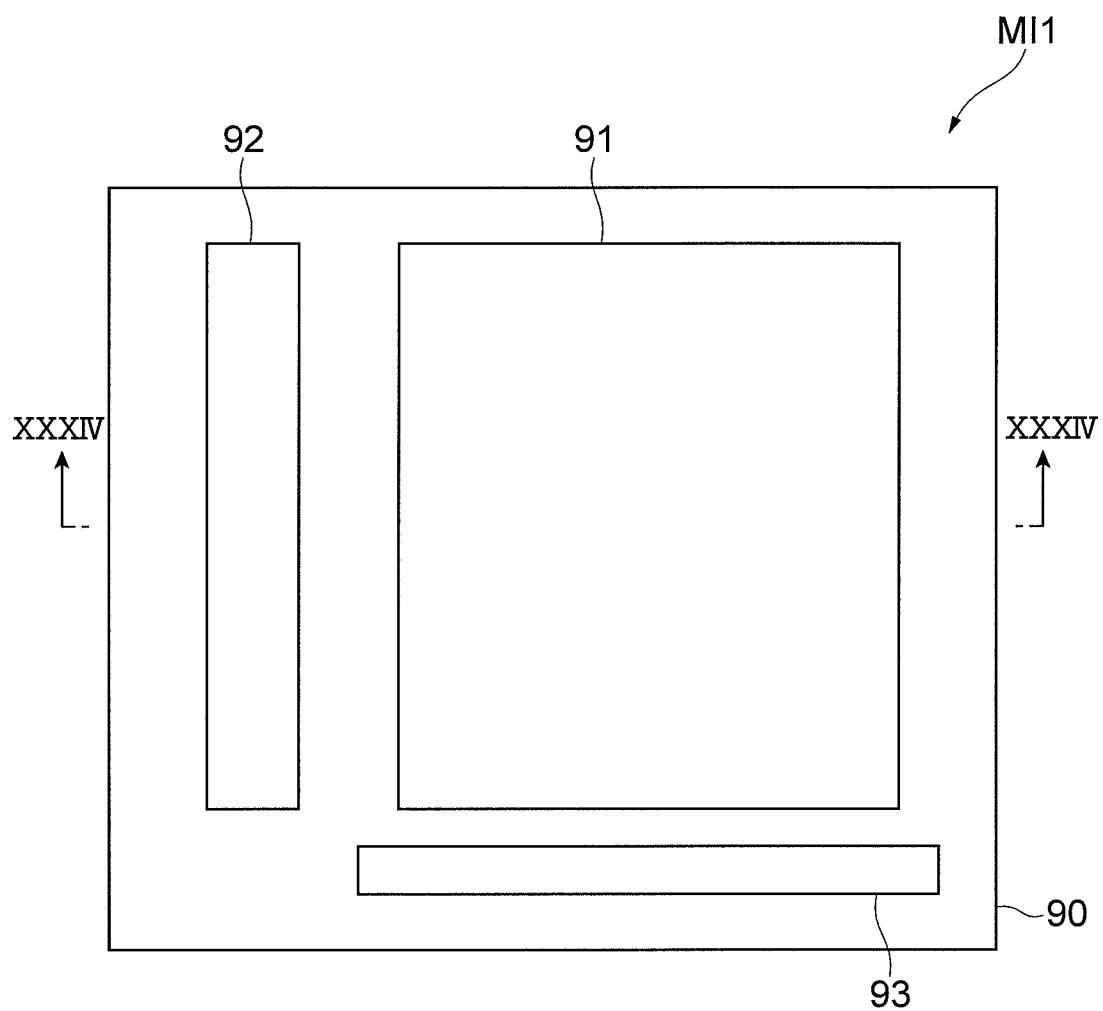
FIG. 33 is a plan view schematically showing a MOS image sensor according to the tenth embodiment.
Figure 34:
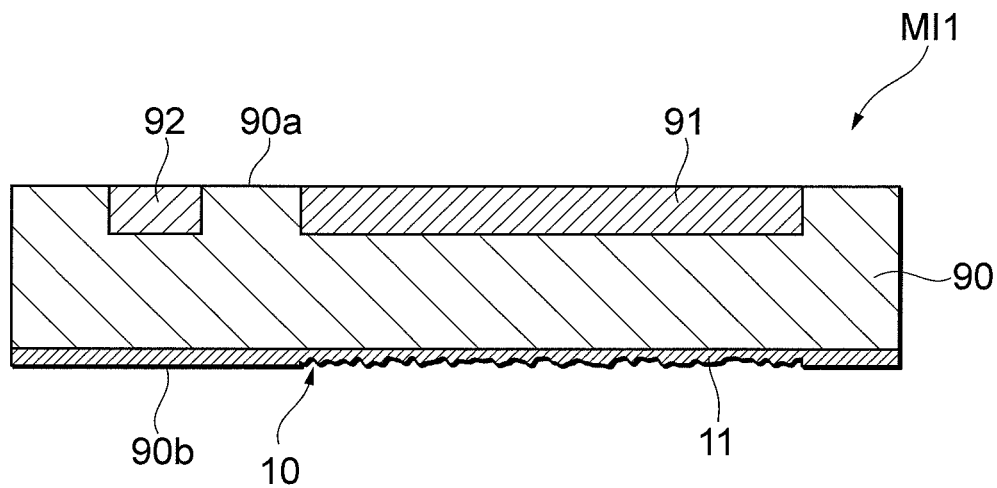
FIG. 34 is a drawing showing a cross-sectional configuration along the line XXXIV-XXXIV in FIG. 33.
Figure 34:
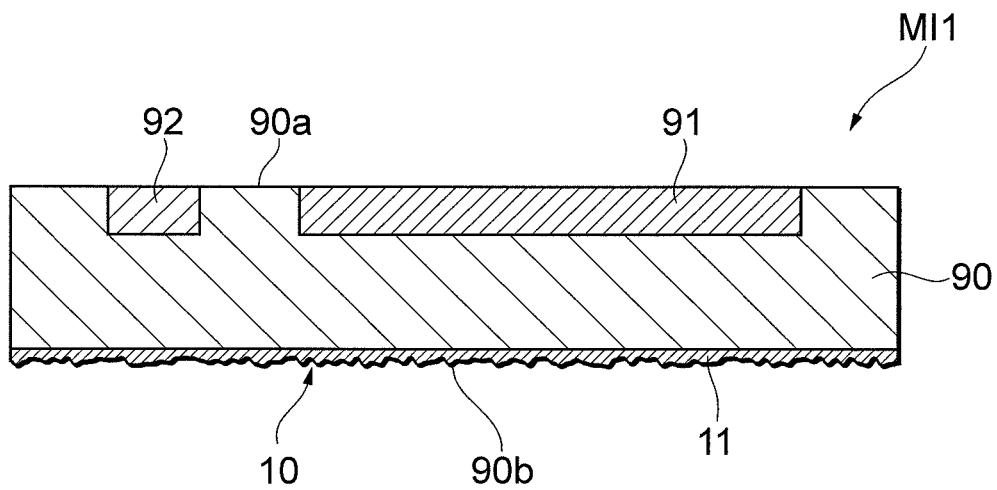

A MOS image sensor MI1 according to the tenth embodiment will be described with reference to FIG. 33. FIG. 33 is a plan view schematically showing the MOS image sensor according to the tenth embodiment. FIG. 34 is a drawing showing a cross-sectional configuration along the line XXXIV-XXXIV of the MOS image sensor shown in FIG. 33.

The MOS image sensor MI1 is provided with a semiconductor substrate 90 of the first conductivity type comprised of silicon. There are a light receiving portion 91, a vertical shift register 92 for selection of rows, and a horizontal shift register 93 for selection of columns, formed in the semiconductor substrate 90. The light receiving portion 91, as shown in FIG. 34 (a), is arranged on the first principal surface 90a side of the semiconductor substrate 90. A plurality of pixels (not shown) are two-dimensionally arranged in the light receiving portion 91. The vertical shift register 92 is arranged beside the light receiving portion 91 (on the lift side in FIG. 33). The horizontal shift register 93 is also arranged beside the light receiving portion 91 (on the lower side in FIG. 33)

The irregular asperity 10 is formed, as shown in FIG. 34 (a), in a region corresponding to the light receiving portion 91 in a second principal surface 90b of the semiconductor substrate 90. The accumulation layer 11 is formed on the second principal surface 90b side of the semiconductor substrate 90 and the second principal surface 90b is optically exposed. The irregular asperity 10 may be formed throughout the entire area of the second principal surface 90b of the semiconductor substrate 90, as shown in FIG. 34 (b).

Figure 35:
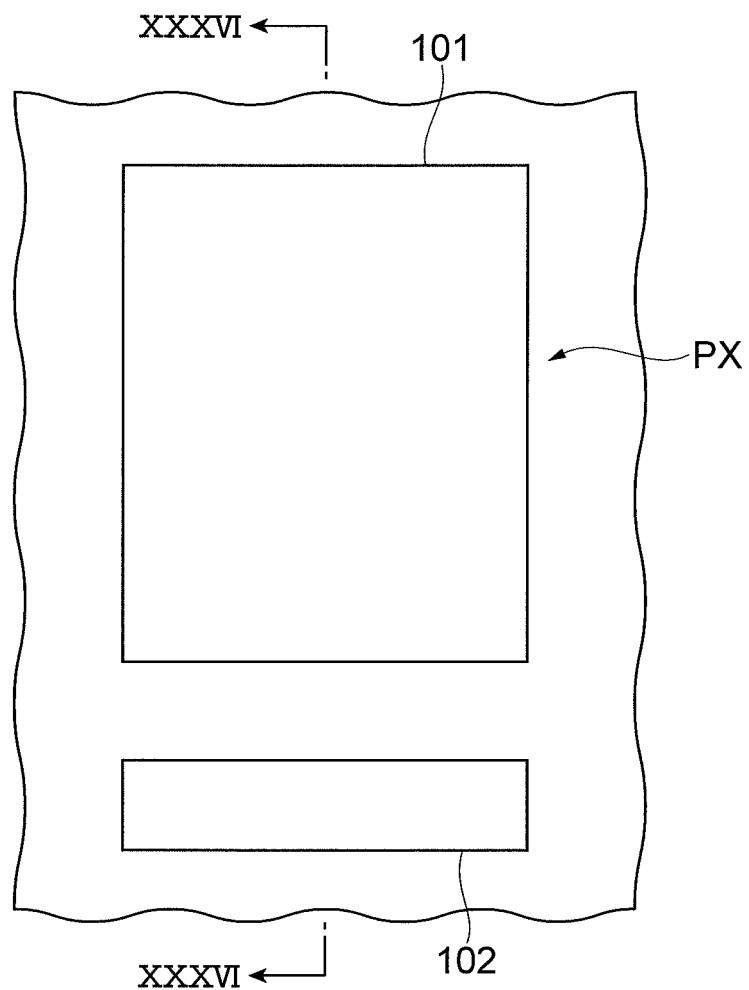
FIG. 35 is a plan view showing a pixel in the MOS image sensor according to the tenth embodiment.
Figure 36:
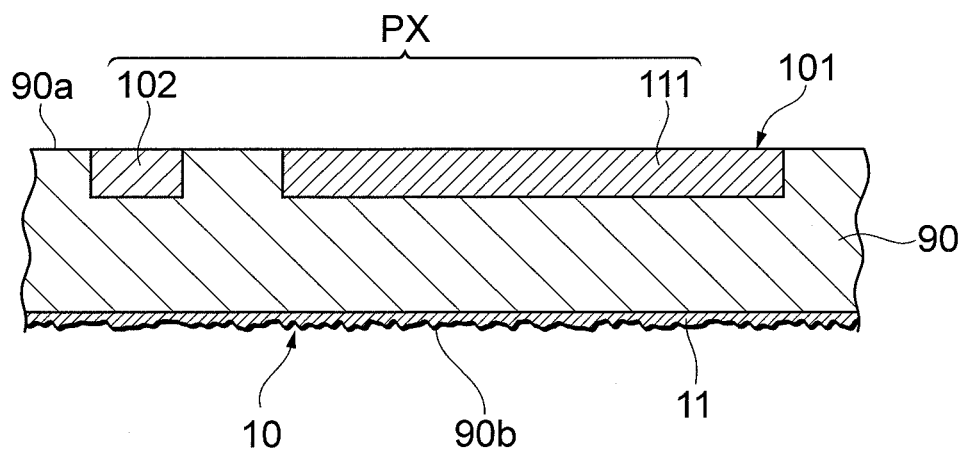
FIG. 36 is a drawing showing a cross-sectional configuration along the line XXXVI-XXXVI in FIG. 35.
Figure 36:
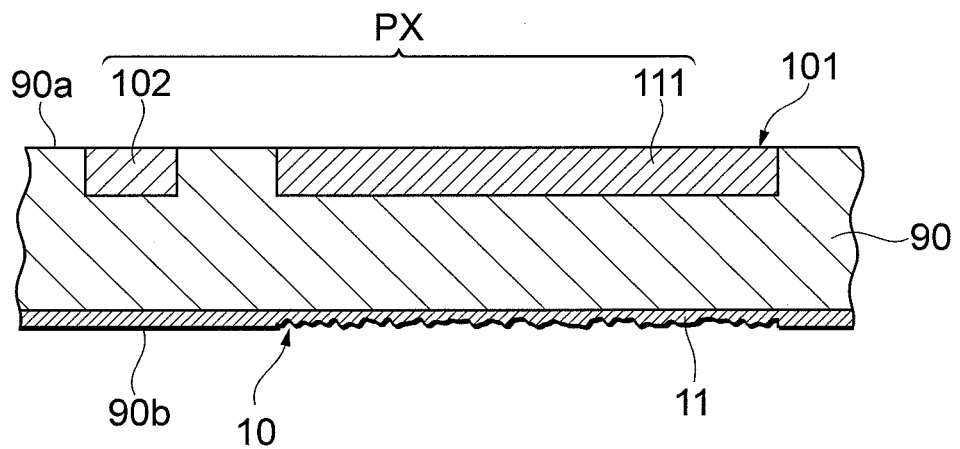

The below will describe a configuration of each pixel PX arranged in the light receiving portion 91 of the MOS image sensor MI1, with reference to FIGS. 35 and 36. FIG. 35 is a plan view showing an enlarged pixel in the MOS image sensor according to the tenth embodiment. FIG. 36 is a drawing showing a cross-sectional configuration along the line XXXVI-XXXVI in FIG. 36.

Each pixel PX, as shown in FIG. 35, is composed of a light receiving region 101 and an attendant circuit 102. In a case where the MOS image sensor MI1 is a PPS (Passive Pixel Sensor), the attendant circuit 102 is composed of a readout FET. In a case where the MOS image sensor MI1 is an APS (Active Pixel Sensor), the attendant circuit 102 is composed of an amplifying circuit including four transistors and others.

The light receiving region 101, as shown in FIG. 36 (a), is a photodiode comprised of a pn junction composed of the semiconductor substrate 90 and a second conductivity type semiconductor region 111. The attendant circuit 102 is arranged beside the second conductivity type semiconductor region 111 (on the left side in FIG. 36 (a)). The irregular asperity 10 is formed throughout the entire area of the pixel PX in the second principal surface 90b of the semiconductor substrate 90. The irregular asperity 10 may be formed only in a region corresponding to the light receiving region 101 (second conductivity type semiconductor region 111) in the second principal surface 90b of the semiconductor substrate 90, as shown in FIG. 36 (b).

In the tenth embodiment, as in the other embodiments, the travel distance of light incident into the MOS image sensor MI1 also becomes long and the distance of absorption of light also becomes long. This allows the MOS image sensor MI1 also to be improved in the spectral sensitivity characteristic in the near-infrared wavelength band.

In the tenth embodiment, the semiconductor substrate 90 may be thinned after completion of the processing process on the first principal surface 90a side of the semiconductor substrate 90. In this case, the MOS image sensor is obtained with respective light incident surfaces on the first principal surface 90a and second principal surface 90b sides of the semiconductor substrate 90.

It is noted that the mode shown in the tenth embodiment is not applied only to the MOS image sensor. The mode shown in the tenth embodiment is also applicable to a CMOS image sensor, photo IC, CMOS photo IC, or the like to detect light in the near-infrared wavelength band.

The above described the preferred embodiments of the present invention, but it should be noted that the present invention is not always limited to the above-described embodiments but can be modified in various ways without departing from the scope and spirit of the invention.

In the first to fifth embodiments the irregular asperity 10 is formed by irradiating the entire area of the second principal surface 1b with the pulsed laser beam, but the present invention is not limited to it. For example, the irregular asperity 10 may also be formed by irradiating only the region opposed to the p$^+$ type semiconductor region 3 in the second principal surface 1b of the n$^-$ type semiconductor substrate 1 with the pulsed laser beam.

In the first to fifth embodiments the electrode 15 is in electrical contact with and connection to the n$^+$ type semiconductor region 5 formed on the first principal surface 1a side of the n$^-$ type semiconductor substrate 1, but it is not limited only to this example. For example, the electrode 15 may be in electrical contact with and connection to the accumulation layer 11 formed on the second principal surface 1b side of the n$^-$ type semiconductor substrate 1. In this case, the electrode 15 is preferably formed outside the region opposed to the p$^+$ type semiconductor region 3 in the second principal surface 1b of the n$^-$ type semiconductor substrate 1. The reason for it is as follows: if the electrode 15 is formed in the region opposed to the p$^+$ type semiconductor region 3 in the second principal surface 1b of the n$^-$ type semiconductor substrate 1, the irregular asperity 10 formed in the second principal surface 1b is blocked by the electrode 15, causing an event of reduction in the spectral sensitivity in the near-infrared wavelength band.

The conductivity types of p-type and n-type may be interchanged so as to be reverse to those described above in the photodiodes PD1-PD5, photodiode arrays PDA1-3, solid-state imaging device SI1, and MOS image sensor MI1 according to the embodiments of the present invention.

Incidentally, there is a conventional technology of "a manufacturing method of a silicon-based detector with a surface layer doped with sulfur and microstructured with a laser" as disclosed in Japanese Translation of PCT International Application Laid-open No. 2008-515196. In the foregoing Laid-open No. 2008-515196, each of positions on a surface of a silicon substrate is irradiated with at least one femtosecond laser pulse and, at the same time, the surface is exposed to a substance containing sulfur, to form a plurality of sulfur-containing portions in the surface layer of the substrate. In this manner, an impurity level is formed in the bandgap of silicon in the Laid-open No. 2008-515196, so as to improve the infrared sensitivity. Therefore, the photodetector disclosed in the Laid-open No. 2008-515196 is different from the semiconductor light-detecting elements of the embodiments of the present invention with the improved spectral sensitivity characteristic in the near-infrared region because of the lengthened travel distance of light incident into the semiconductor light-detecting element and the lengthened distance of absorption of light as well. Furthermore, the photodetector disclosed in the Laid-open No. 2008-515196 detects light by the photoelectric effect, which is different from the semiconductor light-detecting elements of the embodiments of the present invention.

Conventionally, there were only semiconductor light receiving elements using compound semiconductors, as semiconductor light receiving elements with practical spectral sensitivity in the wavelength range of not less than 1000 nm. However, the present invention has realized the semiconductor light receiving elements capable of detecting the near-infrared light in the wavelength range of not less than 1000 nm using silicon inexpensive in raw materials and processing cost and easy to process, thereby providing a great industrial advantage.

INDUSTRIAL APPLICABILITY

The present invention is applicable to semiconductor light-detecting elements and light-detecting apparatus.

LIST OF REFERENCE SIGNS 1 n$^-$ type semiconductor substrate; 1a first principal surface; 1b second principal surface; 3 p$^+$ type semiconductor region; 5 n$^+$ semiconductor region: 10 irregular asperity; 11 accumulation layer; 13, electrodes; PL pulsed laser beam;

PD1-PD5 photodiodes; PDA1-3 photodiode arrays; SI1 solid-state imaging device; MI1 MOS image sensor.

The invention claimed is:

1. A semiconductor light-detecting element comprising:
    a silicon substrate having a principle surface and having a pn junction comprised of a semiconductor region of a first conductivity type and a semiconductor region of a second conductivity type,
    wherein on the silicon substrate, an accumulation layer of the first conductivity type is formed on a principal surface side of the silicon substrate and an irregular asperity is formed in at least a region opposed to the pn junction in the principal surface,
    wherein the region opposed to the pn junction in the principal surface of the silicon substrate is optically exposed, and
    wherein a surface opposed to the principal surface where the irregular asperity is formed constitutes a light incident surface, light incident from the light incident surface travels in the silicon substrate, the semiconductor light-detecting element being a front-illuminated type.

2. The semiconductor light-detecting element according to claim 1, wherein a thickness of the accumulation layer of the first conductivity type is larger than a height difference of the irregular asperity.

3. The semiconductor light-detecting element according to claim 1, wherein the light incident from the light incident surface and traveling in the silicon substrate is reflected, scattered, or diffused by the irregular asperity.

4. The semiconductor light-detecting element according to claim 1, wherein no electrode is formed on the region opposed to the pn junction in the principal surface of the silicon substrate.

* * * * *